United States Patent
Lai et al.

(10) Patent No.: US 11,393,769 B2
(45) Date of Patent: Jul. 19, 2022

(54) ALIGNMENT STRUCTURE FOR SEMICONDUCTOR DEVICE AND METHOD OF FORMING SAME

(71) Applicant: Taiwan Semiconductor Manufacturing Co., Ltd., Hsinchu (TW)

(72) Inventors: Chi-Sheng Lai, Hsinchu (TW); Wei-Chung Sun, Hsinchu (TW); Li-Ting Chen, Hsinchu (TW); Kuei-Yu Kao, Hsinchu (TW); Chih-Han Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 4 days.

(21) Appl. No.: 16/869,894

(22) Filed: May 8, 2020

(65) Prior Publication Data
US 2021/0257310 A1    Aug. 19, 2021

Related U.S. Application Data

(60) Provisional application No. 62/978,489, filed on Feb. 19, 2020.

(51) Int. Cl.
*H01L 23/544* (2006.01)
*H01L 29/66* (2006.01)
(Continued)

(52) U.S. Cl.
CPC .... *H01L 23/544* (2013.01); *H01L 21/823437* (2013.01); *H01L 21/823821* (2013.01);
(Continued)

(58) Field of Classification Search
CPC ............ H01L 29/66795; H01L 29/785; H01L 27/0924; H01L 29/66545; H01L 21/823437; H01L 21/823821
See application file for complete search history.

(56) References Cited

U.S. PATENT DOCUMENTS 5,889,335 A     3/1999 Kuroi et al.
2011/0284966 A1*  11/2011 Wen ................ H01L 21/823493
                                                257/E27.06
(Continued)

FOREIGN PATENT DOCUMENTS

CN      103515440 A  *  1/2014
CN      103515440 A  *  1/2014  ....... H01L 21/30604

*Primary Examiner* — Tuan A Hoang
(74) *Attorney, Agent, or Firm* — Slater Matsil, LLP

(57) ABSTRACT

An alignment structure for a semiconductor device and a method of forming same are provided. A method includes forming an isolation region over a substrate and forming an alignment structure over the isolation region. Forming the alignment structure includes forming a sacrificial gate electrode layer over the substrate and the isolation region. The sacrificial gate electrode layer is patterned to form a plurality of first sacrificial gates over the isolation region. At least one of the plurality of first sacrificial gates is reshaped. The at least one of the plurality of first sacrificial gates is disposed at an edge of the alignment structure in a plan view. A sidewall of the at least one of the plurality of first sacrificial gates comprises a notch at an interface between the at least one of the plurality of first sacrificial gates and the isolation region.

20 Claims, 41 Drawing Sheets

(51) Int. Cl.
*H01L 27/092* (2006.01)
*H01L 21/8238* (2006.01)
*H01L 29/78* (2006.01)
*H01L 21/8234* (2006.01)

(52) U.S. Cl.
CPC .. *H01L 21/823878* (2013.01); *H01L 27/0924* (2013.01); *H01L 29/66545* (2013.01); *H01L 29/66795* (2013.01); *H01L 29/785* (2013.01); *H01L 2223/54426* (2013.01)

(56) References Cited

U.S. PATENT DOCUMENTS

| | | | |
|---|---|---|---|
| 2015/0228647 A1* | 8/2015 | Chang | H01L 21/823431 438/596 |
| 2018/0331105 A1* | 11/2018 | Kim | H01L 29/66545 |
| 2020/0006148 A1* | 1/2020 | Chen | H01L 29/66553 |

* cited by examiner

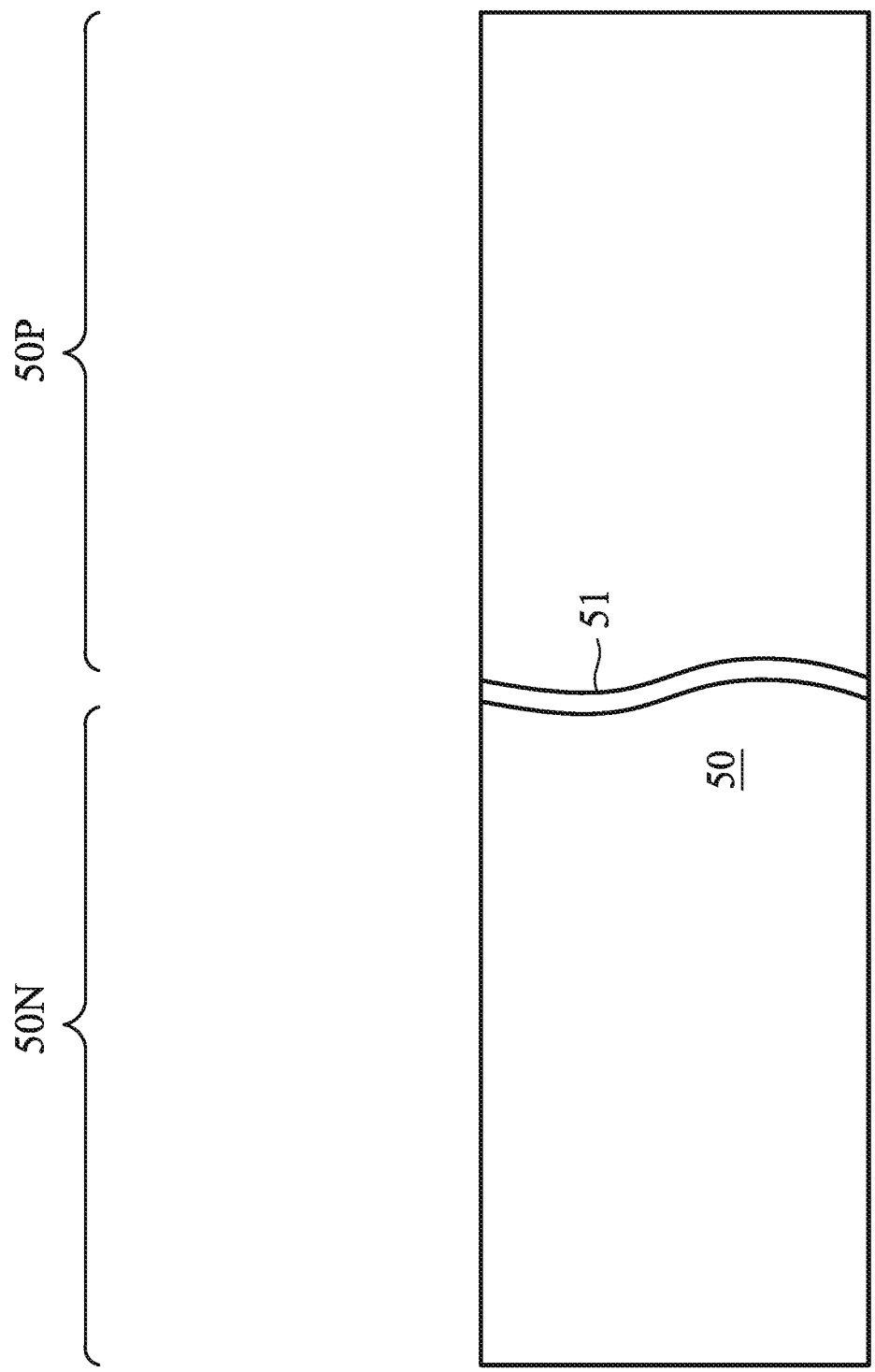

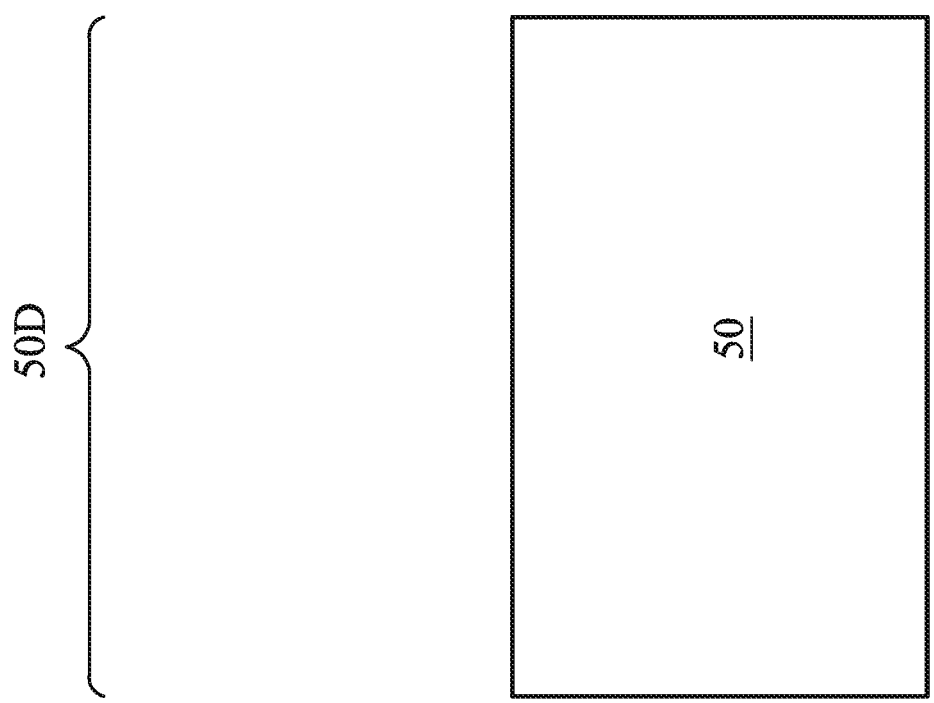

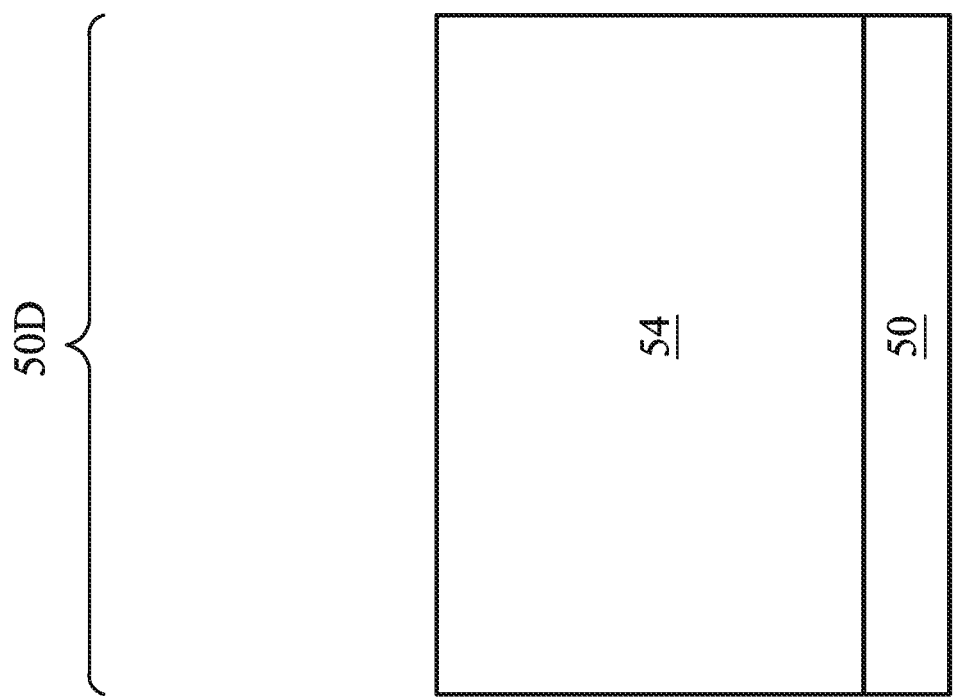

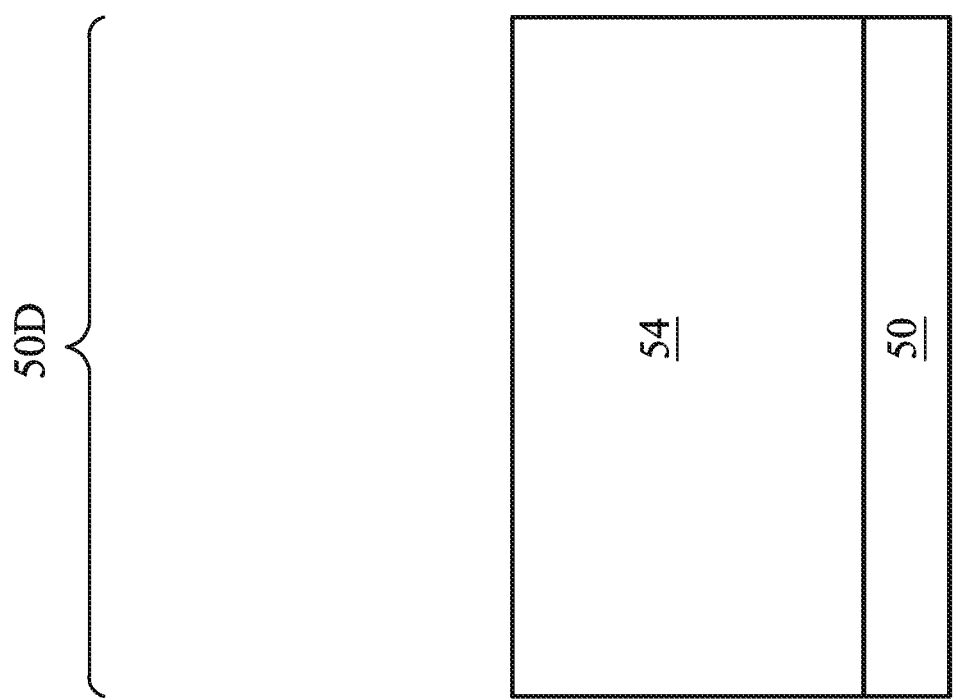

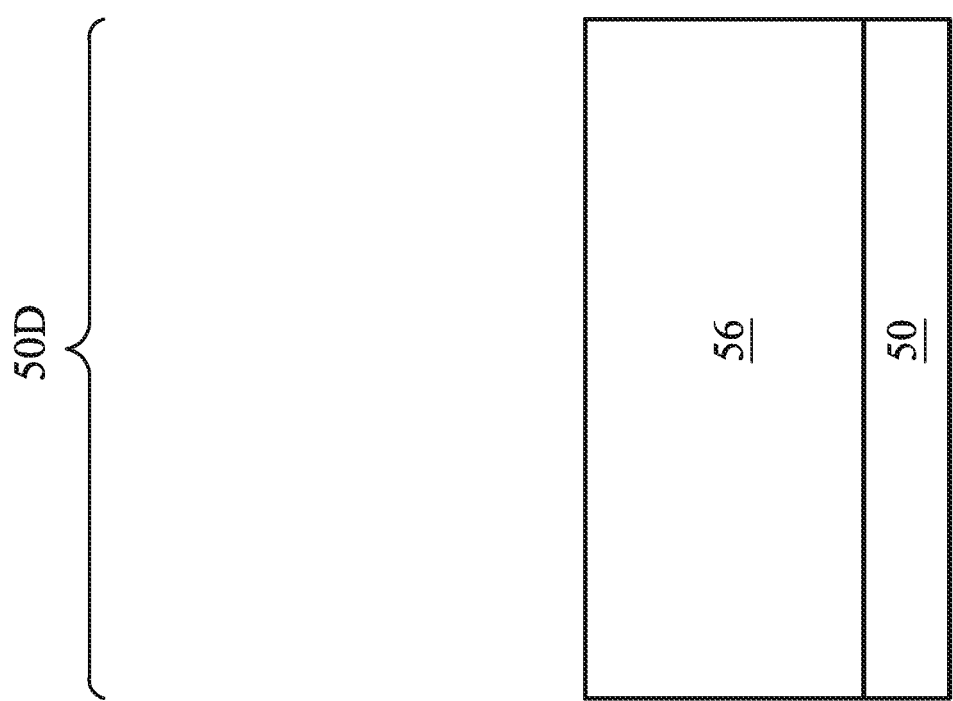

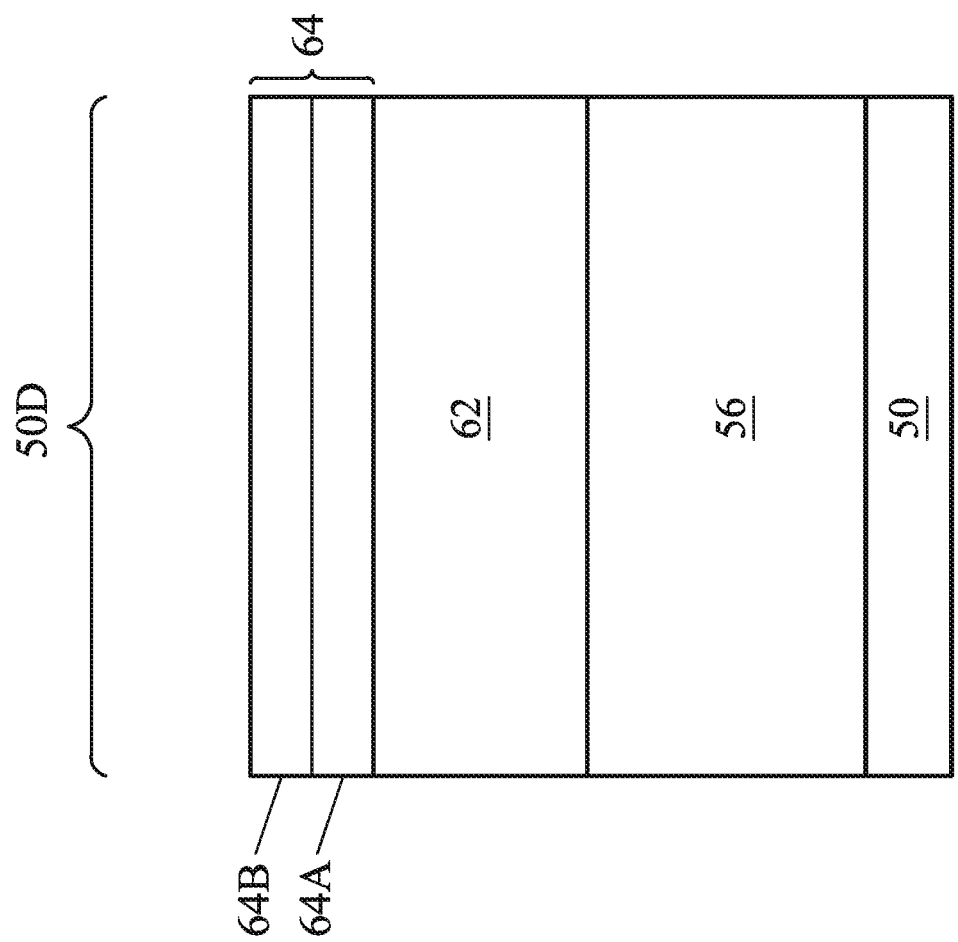

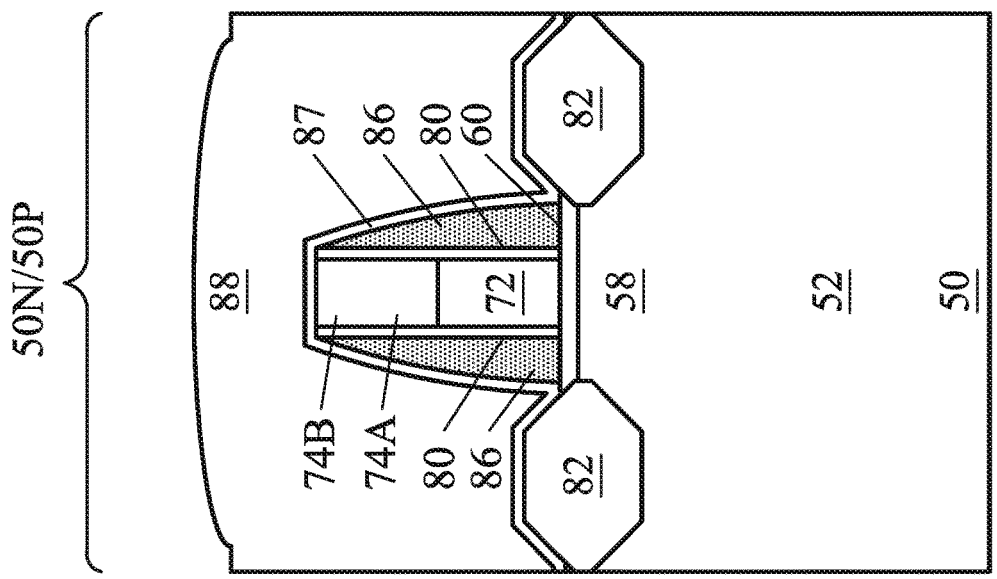
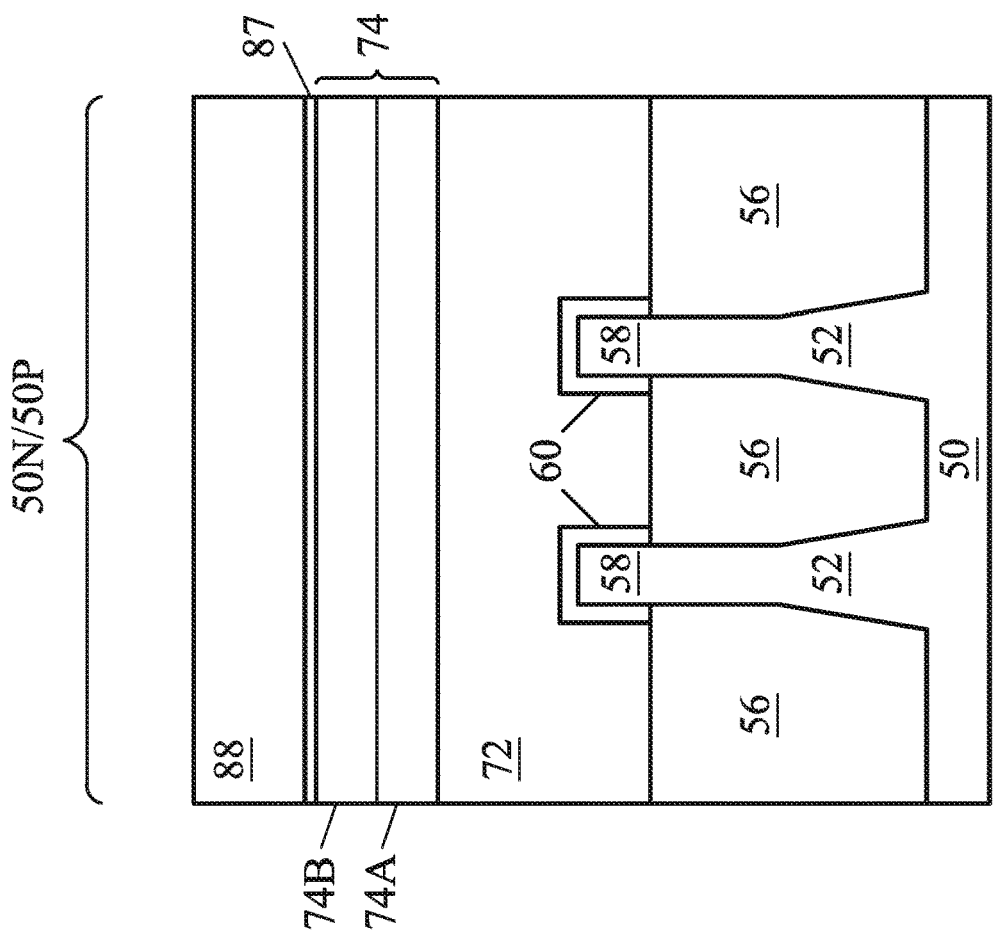
Figure 17B
Figure 17A

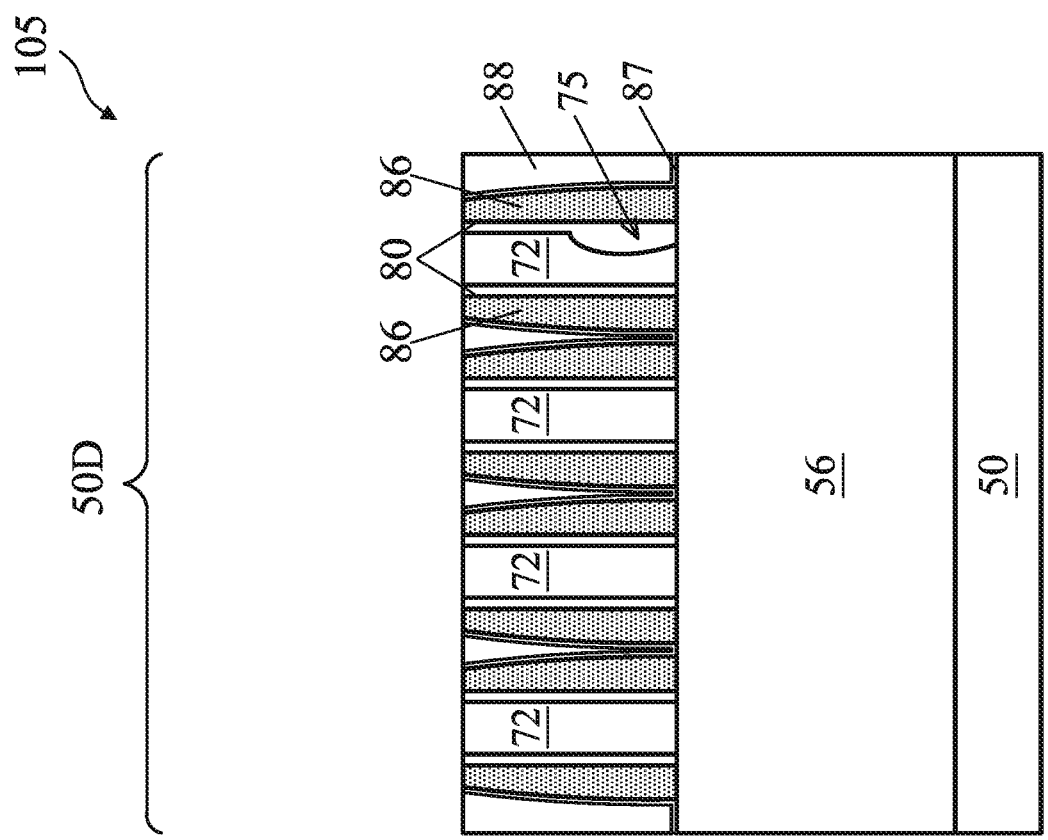

ALIGNMENT STRUCTURE FOR SEMICONDUCTOR DEVICE AND METHOD OF FORMING SAME

PRIORITY CLAIM AND CROSS-REFERENCE

This application claims the benefit of U.S. Provisional Application No. 62/978,489, filed on Feb. 19, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A, 4D, 5A, 5D, 6A, 6D, 7A, 7D, 8A, 8D, 9A, 9D, 10A, 10B, 10D, 11A, 11B, 11D, 12A, 12B, 12D, 13A, 13B, 13D, 14A, 14B, 14D, 15C, 16C, 17A, 17B, 17D, 18A, 18B, 18D, 19A, 19B, 19D, 20A, 20B, 20D, 21B, 22A, 22B, 22D, 23A, 23B, and 23D are cross-sectional views of intermediate stages in the manufacturing of a FinFET device in accordance with some embodiments.

DETAILED DESCRIPTION

Figure 1:
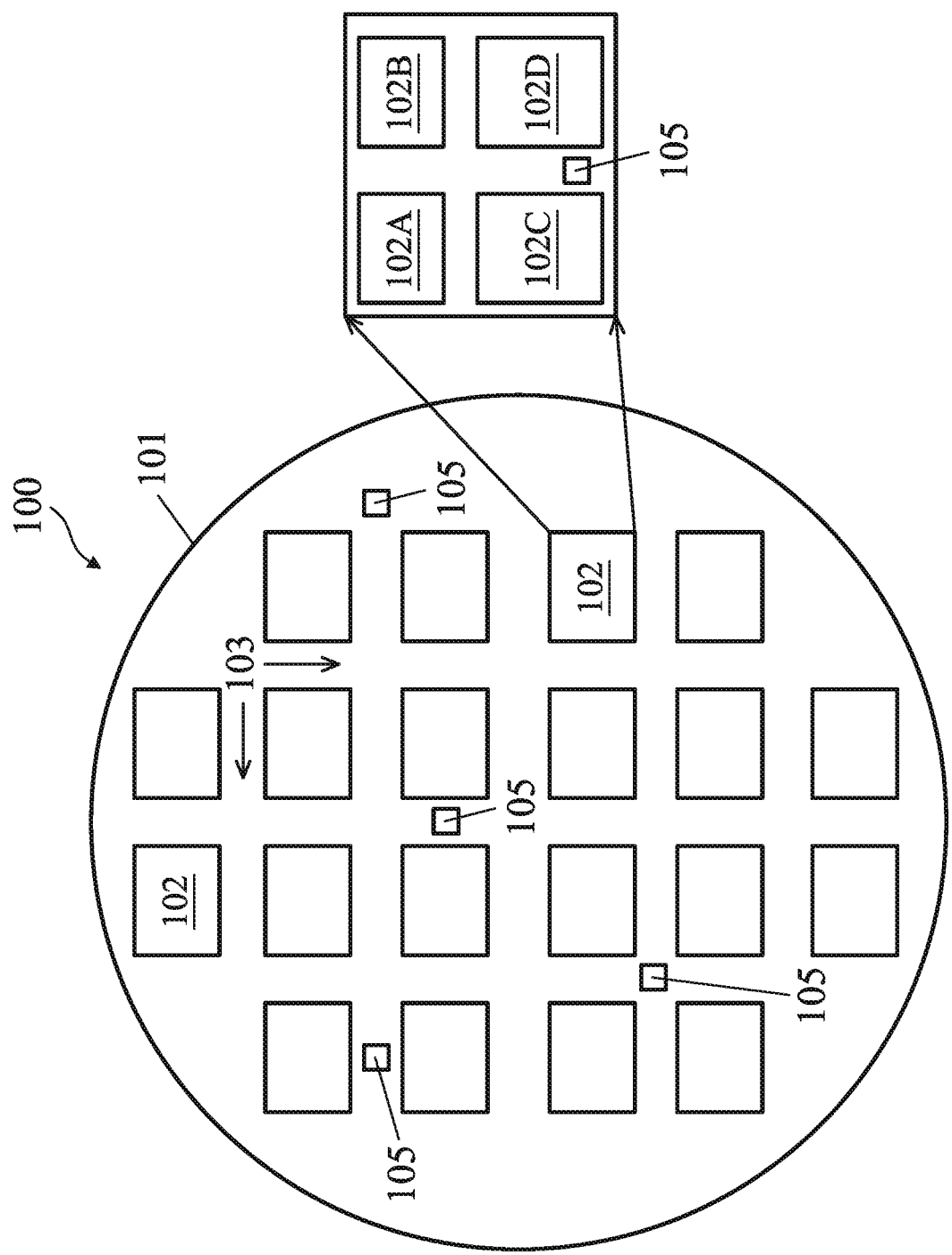
FIG. 1 illustrates a top view of a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, an alignment structure for a semiconductor device and a method of forming the same. Various embodiments presented herein are discussed in the context of a FinFET device formed using a gate-last process. In other embodiments, a gate-first process may be used. Also, some embodiments contemplate aspects used in planar transistor devices, multiple-gate transistor devices, 2D transistor devices, gate-all-around transistor devices, nanowire transistor devices, or the like. Various embodiments presented herein allow for forming an alignment structure comprising a plurality of dummy gates, such that the formation of footing features of the dummy gates that are located at edges of the alignment structure are prevented or avoided. Such an alignment structure allows for improving the alignment between various features of a FinFET device such as, for example, between active gate structures and source/drain contacts of the FinFET device. Accordingly, a yield and a reliability of the FinFET device may be improved.

Figure 2:
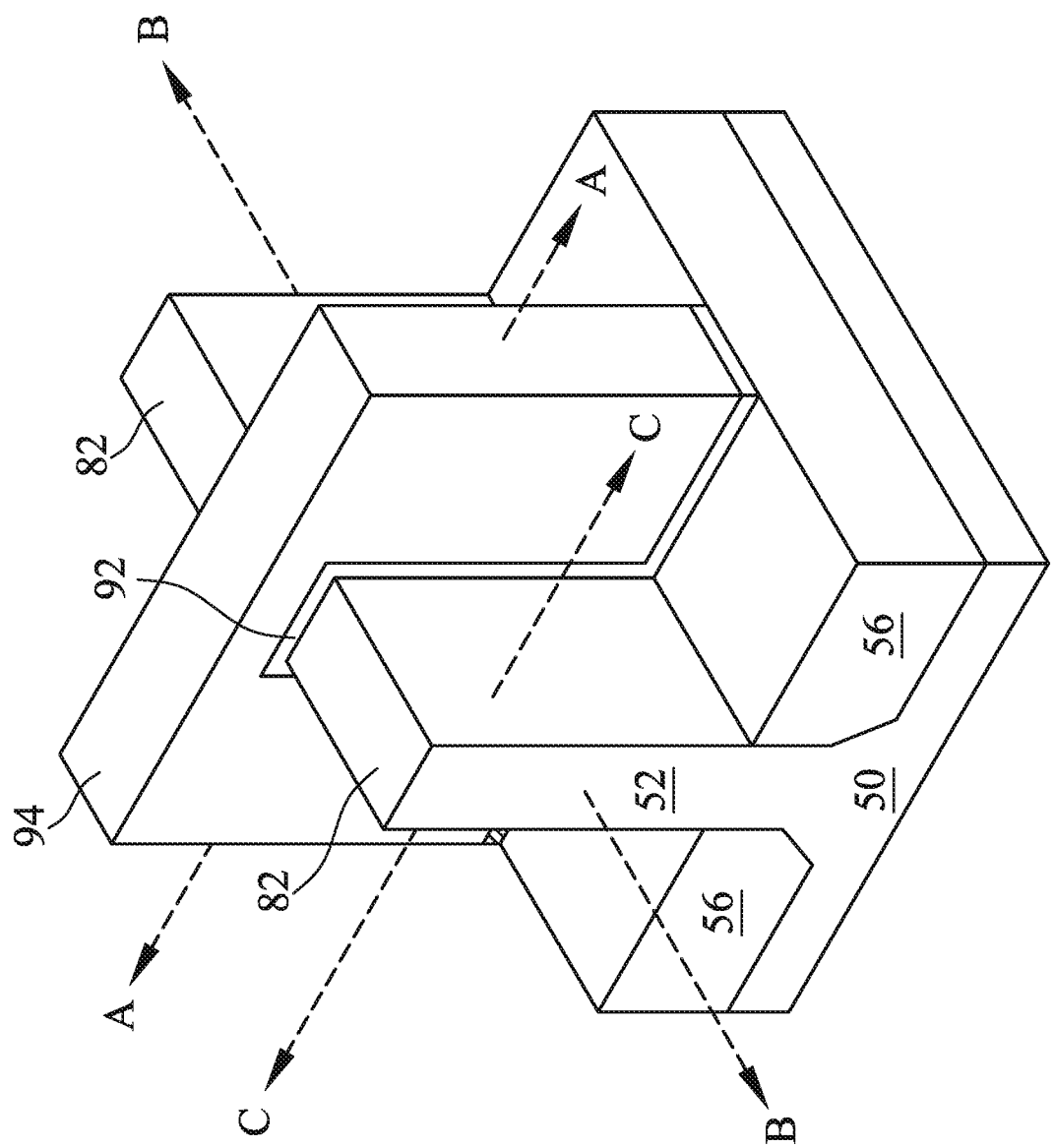
FIG. 2 illustrates an example of a FinFET in a three-dimensional view in accordance with some embodiments.

FIG. 1 illustrates a top view of a semiconductor device 100 in accordance with some embodiments. In some embodiments, the semiconductor device 100 comprises a wafer 101. The wafer 101 comprises a plurality of die regions 102 separated from each other by dicing streets 103. In some embodiments, each of the die regions 102 may comprise a semiconductor device, such as a FinFET device, for example. Such an exemplary device is illustrated in FIG. 2. The dicing streets 103 may be also referred as singulation regions. In some embodiments, the wafer 101 may be singulated along the dicing streets 103 to separate the die regions 102 from each other and form individual dies. In some embodiments, the semiconductor device 100 further comprises alignment structures 105 formed on the dicing streets 103. In some embodiments, the alignment structures 105 may be disposed at an edge of the wafer 101. In other embodiments, the alignment structures 105 may be disposed at corners of the die regions 102. In yet other embodiments, the alignment structures 105 may be disposed at edges of the die regions 102. The alignment structures 105 may be also referred to as alignment marks. In some embodiments when the alignment structures 105 are formed in the dicing streets 103, the alignment structures 105 may be destroyed during the singulation process.

In some embodiments, each of the die regions 102 comprises one or more chips. In the illustrated embodiments, each of the die regions 102 comprises four chips, such as chips 102A, 102B, 102C, and 102D. In other embodiments, each of the die regions 102 may comprise less or more than four chips depending on the design requirements. In some embodiments when each of the die regions 102 comprises plurality of chips, the alignment structures 105 may be disposed within the die regions 102 between adjacent chips. In such embodiments, the alignment structures 105 are not destroyed during the singulation process.

FIG. 2 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring STI regions 56. Although the STI regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring STI regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and the gate electrode 94. FIG. 2 further illustrates reference cross-sections that are used in later figures. Cross-section A-A is along a longitudinal axis of the gate electrode 94 and in a direction, for example, perpendicular to a direction of a current flow between the source/drain regions 82 of the FinFET. Cross-section B-B is perpendicular to cross-section A-A and is along a longitudinal axis of the fin 52 and in a direction of, for example, the current flow between the source/drain regions 82 of the FinFET. Cross-section C-C is parallel to cross-section A-A and extends through the source/drain region 82 of the FinFET. Some of the subsequent figures refer to these reference cross-sections for clarity.

Figure 3A:
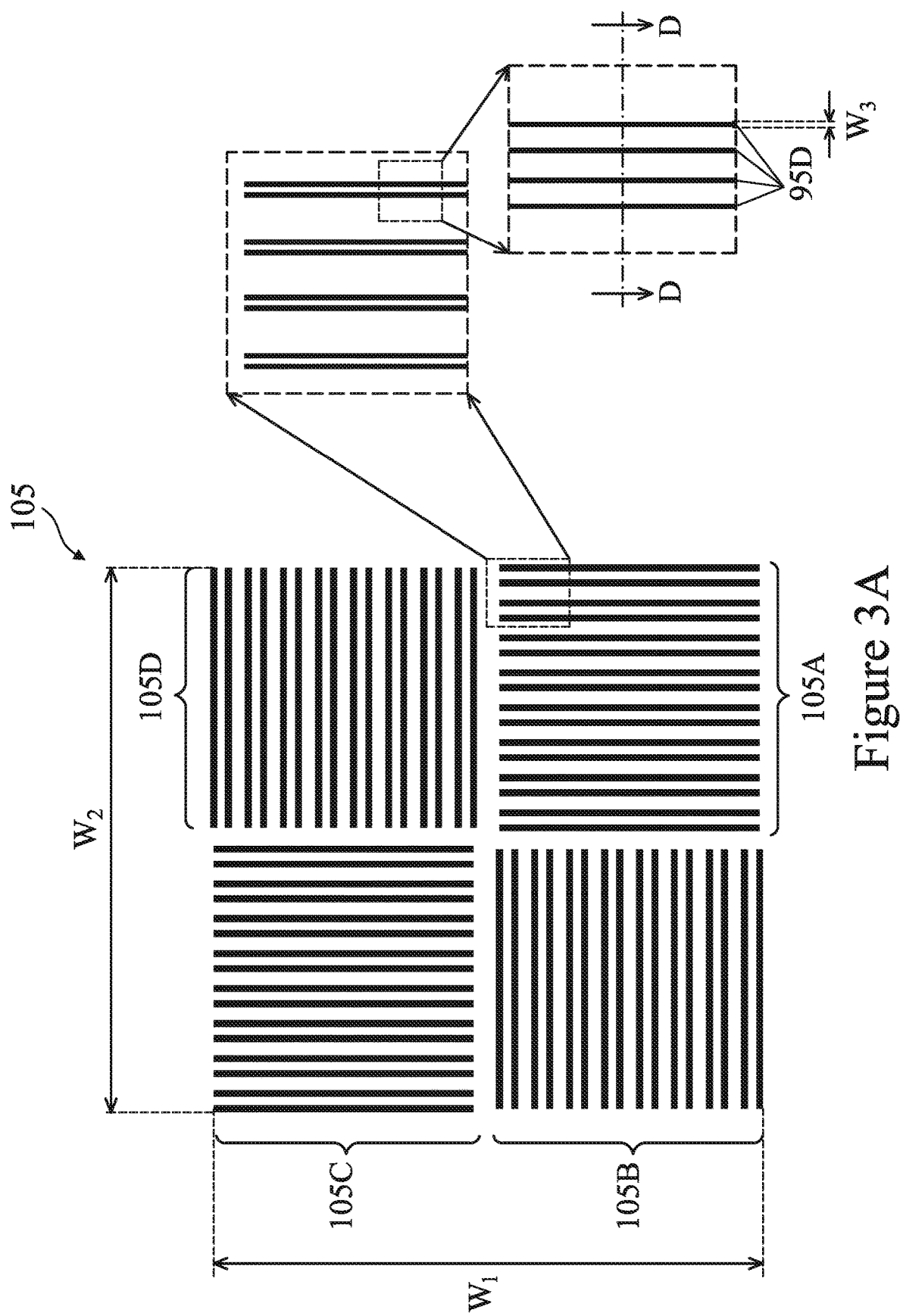
FIGS. 3A and 3D illustrate top and cross-sectional views of an alignment structure in accordance with some embodiments.

FIG. 3A illustrates a top view of an alignment structure 105 in accordance with some embodiments. In some embodiments, the alignment structure 105 comprises regions 105A, 105B, 105C, and 105D. In some embodiments, each of the regions 105A, 105B, 105C, and 105D comprises a plurality of dummy gate stacks 95D that are formed over the STI region 56 disposed over the substrate 50. In some embodiments, the dummy gate stacks 95D are electrically isolated from devices formed in the die regions 102 (see FIG. 1). In some embodiments, the regions 105A and 105C of the alignment structure 105 may have a same first pattern. In some embodiments, the regions 105B and 105D of the alignment structure 105 may have a same second pattern. In some embodiments, 90 degree-rotated first pattern is similar to the second pattern. In some embodiments, the alignment structure has a first width $W_1$ and a second width $W_2$. In some embodiments, the first width $W_1$ may equal to the second width $W_2$. In other embodiments, the first width $W_1$ may be different from the second width $W_2$. In some embodiments, the first width $W_1$ is between about 10 μm and about 50 μm. In some embodiments, the second width $W_2$ is between about 10 μm and about 50 μm. In some embodiments, a ratio $W_1/W_2$ is about 1. In some embodiments, the dummy gates 95D have a width $W_3$ between 15 nm and about 160 nm. In some embodiments, the dummy gates 95D have a pitch between 50 nm and about 220 nm.

FIG. 3A further illustrates reference cross-section D-D that is used in later figures. Reference cross-section D-D is along a direction that is perpendicular to a lengthwise direction of the dummy gate stacks 95D. Some of the subsequent figures refer to this reference cross-section for clarity.

Figure 3D:
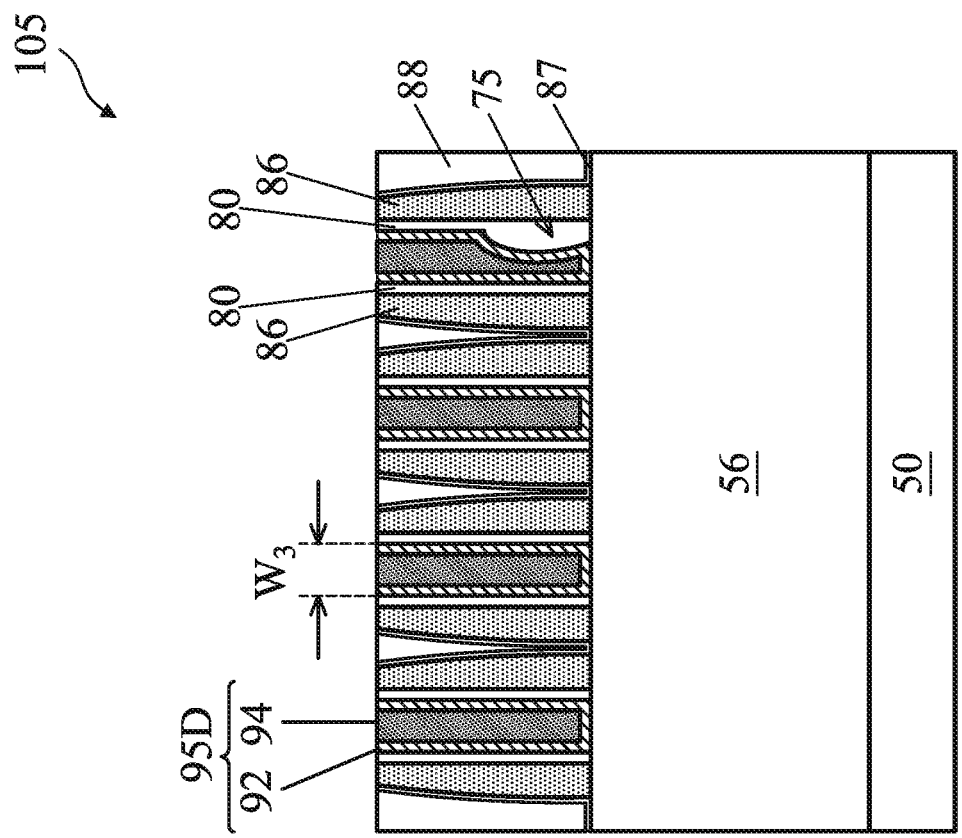

FIG. 3D is illustrated along the reference cross-section D-D illustrated in FIG. 3A. In some embodiments, gate seal spacers 80 and gate spacers 86 are formed on sidewalls of the dummy gate stacks 95D. Subsequently, an interlayer dielectric (ILD) 88 is formed between adjacent dummy gate stacks 95D and an etch stop layer 87 is disposed between the ILD 88 and the gate spacers 86. In some embodiments, a top surface of the ILD 88 is substantially level with top surfaces of the dummy gate stacks 95D. In some embodiments, the dummy gate stacks 95D that are disposed at the edges of the alignment structure 105 may comprise notches 75 at interfaces between the dummy gate stacks 95D and the STI region 56. In some embodiments, the notches 75 extend into the dummy gate stacks 95D from sidewalls of the dummy gate stacks 95D and have curved sidewalls.

Figure 16C:
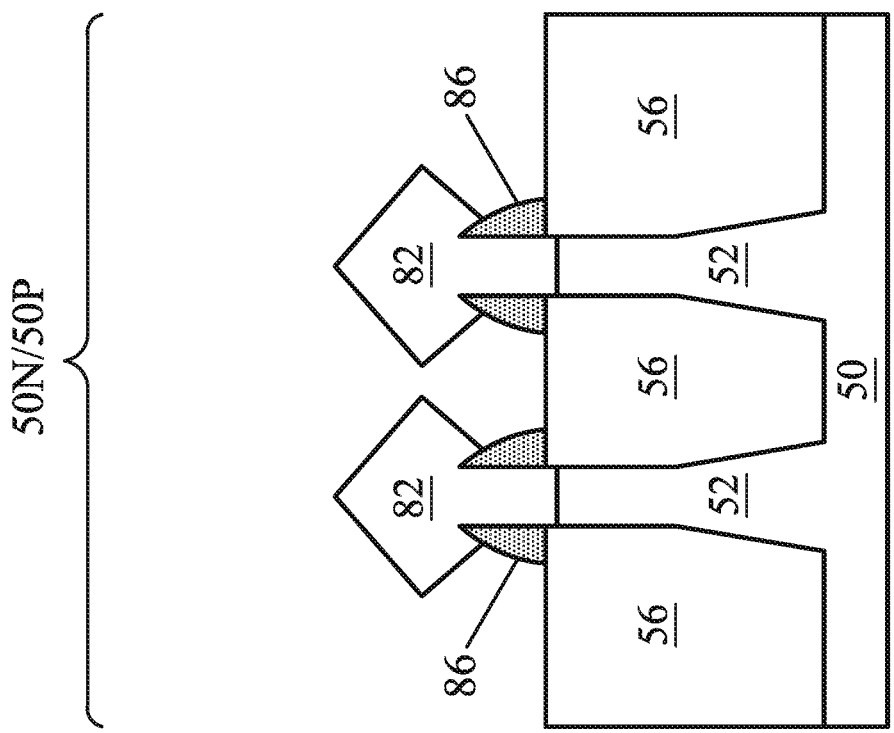

FIGS. 4A, 4D, 5A, 5D, 6A, 6D, 7A, 7D, 8A, 8D, 9A, 9D, 10A, 10B, 10D, 11A, 11B, 11D, 12A, 12B, 12D, 13A, 13B, 13D, 14A, 14B, 14D, 15C, 16C, 17A, 17B, 17D, 18A, 18B, 18D, 19A, 19B, 19D, 20A, 20B, 20D, 21B, 22A, 22B, 22D, 23A, 23B, and 23D are cross-sectional views of intermediate stages in the manufacturing of a FinFET device in accordance with some embodiments. Figures with "A" designation, such as FIGS. 4A-14A, 17A-20A, 22A, and 23A illustrate cross-sectional views along the reference cross-section A-A illustrated in FIG. 2, except for multiple fins/FinFETs. Figures with "B" designation, such as FIGS. 10B-14B and 17B-23B are illustrated along the reference cross-section B-B illustrated in FIG. 2, except for multiple fins/FinFETs. Figures with "C" designation, such as FIGS. 15C and 16C are illustrated along the reference cross-section C-C illustrated in FIG. 2, except for multiple fins/FinFETs. Figures with "D" designation, such as FIGS. 4D-14D, 17D-20D, 22D, and 23D are illustrated along the reference cross-section D-D illustrated in FIG. 3A.

In FIGS. 4A and 4D, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P illustrated in FIG. 4A and a region 50D illustrated in FIG. 4D. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by a divider 51), and any number of device features (e.g., other active devices, doped regions, isolation structures, etc.) may be disposed between the region 50N and the region 50P. The region 50D is a portion of the substrate 50 (such as, for example, a portion of a dicing street 103) where an alignment structure 105 (see FIG. 1) is formed.

Figure 5A:
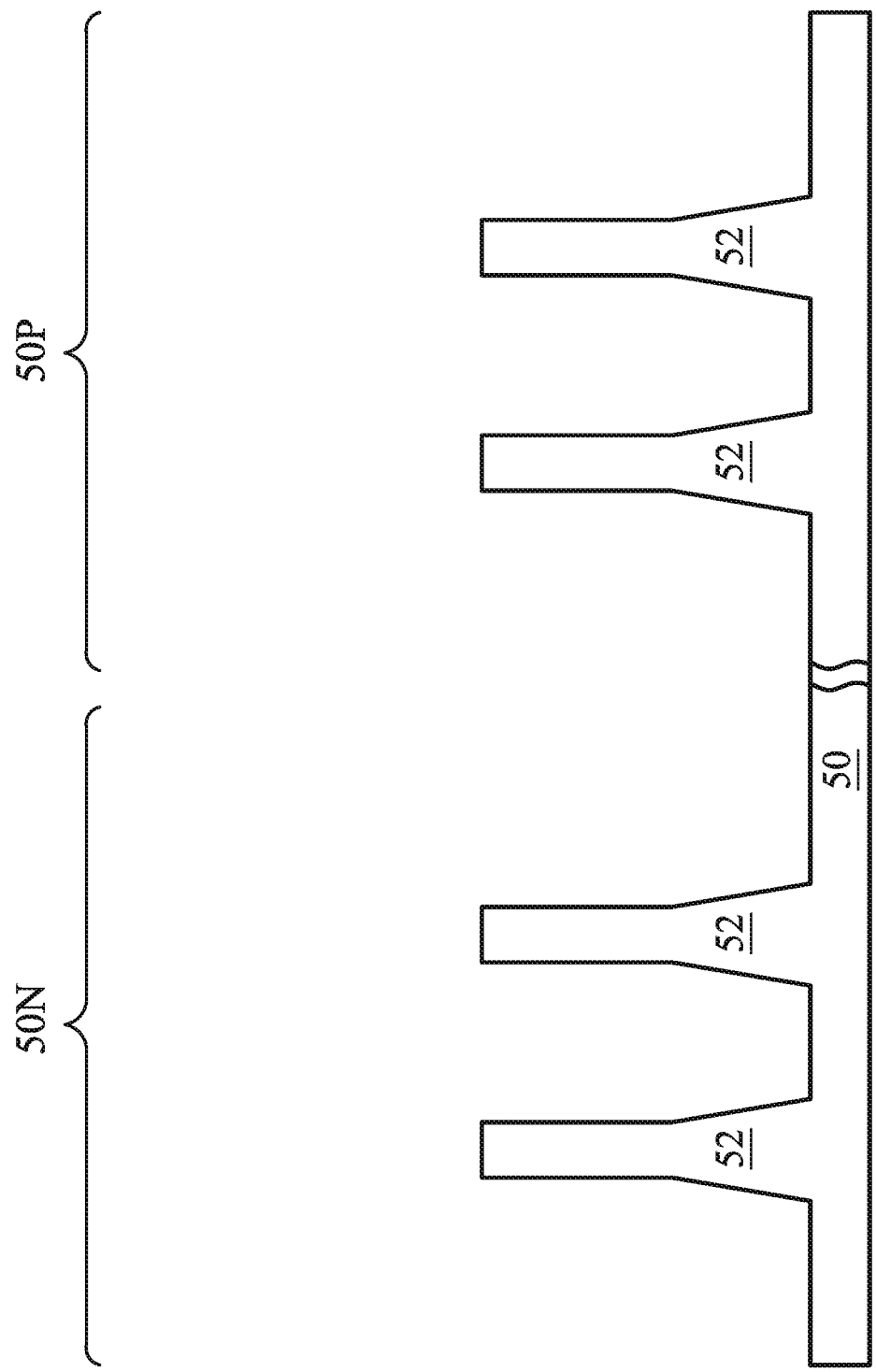

In FIGS. 5A and 5D, fins 52 are formed in the substrate 50 in the regions 50N and 50P. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), a combination thereof, or the like. The etch process may be anisotropic.

The fins may be formed by any suitable method. For example, the fins may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as a mask to form the fins.

Figure 6A:
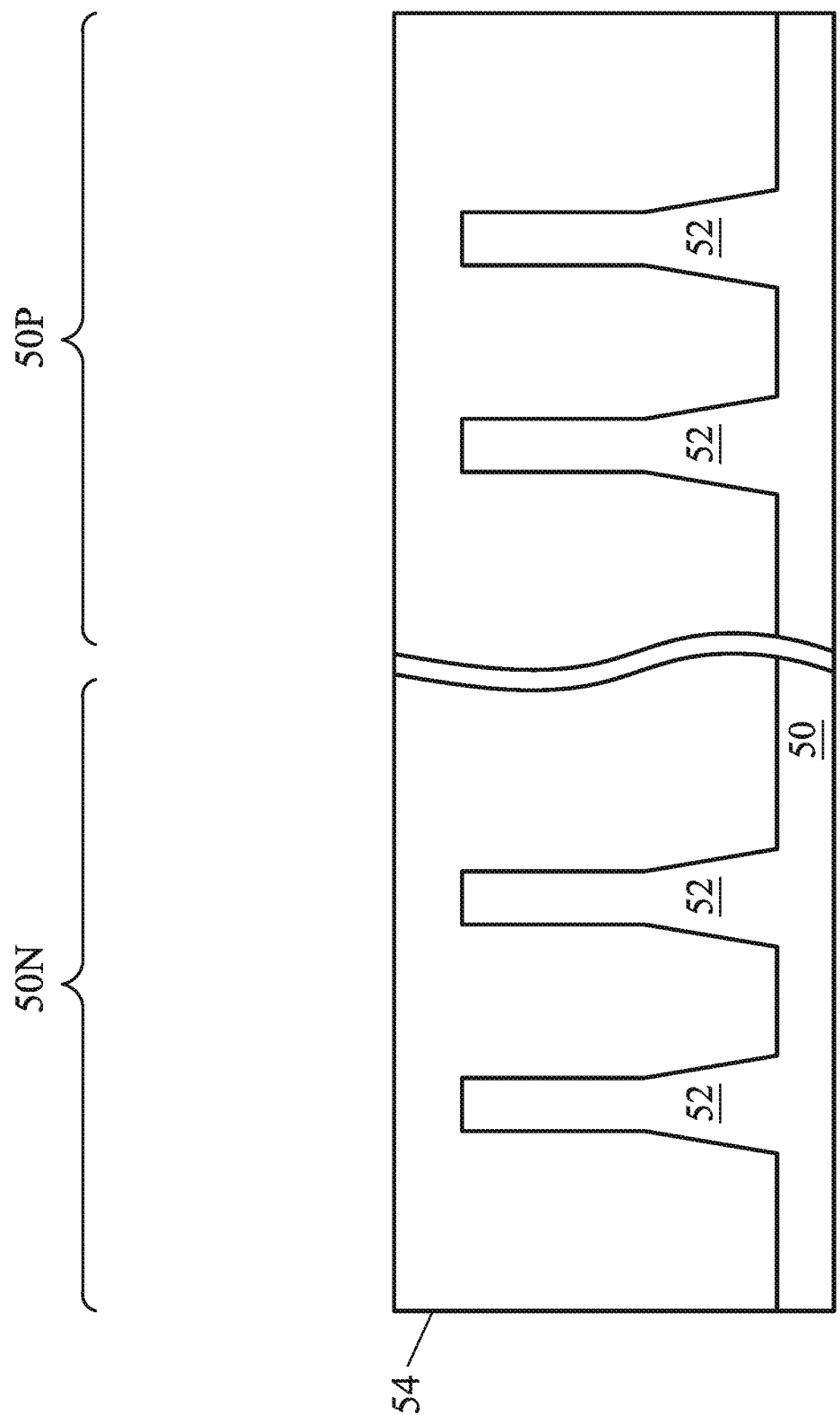

In FIGS. 6A and 6D, an insulation material 54 is formed over the substrate 50 in regions 50N, 50P and 50D, and between neighboring fins 52. The insulation material 54 may be an oxide, such as silicon oxide, a nitride, a combination thereof, or the like, and may be formed by a high density plasma chemical vapor deposition (HDP-CVD), a flowable CVD (FCVD) (e.g., a CVD-based material deposition in a remote plasma system and post curing to make it convert to another material, such as an oxide), a combination thereof, or the like. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments, a liner (not shown) may first be formed along surfaces of the substrate 50 and the fins 52. Thereafter, a fill material, such as those discussed above may be formed over the liner.

Figure 7A:
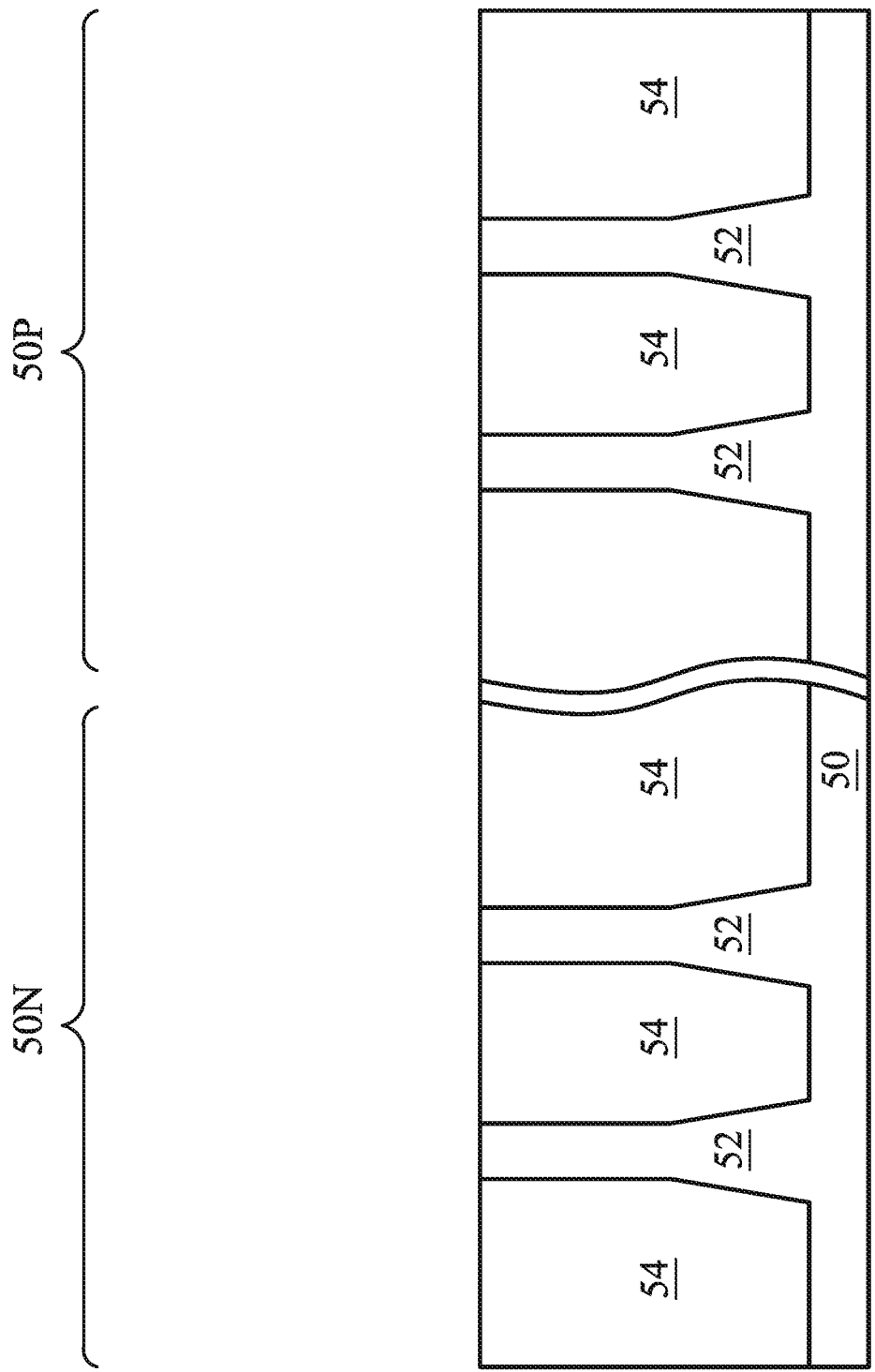

In FIGS. 7A and 7D, a removal process is applied to the insulation material 54 to remove excess portions of the insulation material 54 over the fins 52. In some embodiments, a planarization process, such as a chemical mechanical polish (CMP) process, an etch back process, combinations thereof, or the like, may be utilized. The planarization process exposes the fins 52 such that top surfaces of the fins 52 and the top surface of the insulation material 54 are level after the planarization process is completed.

Figure 8A:
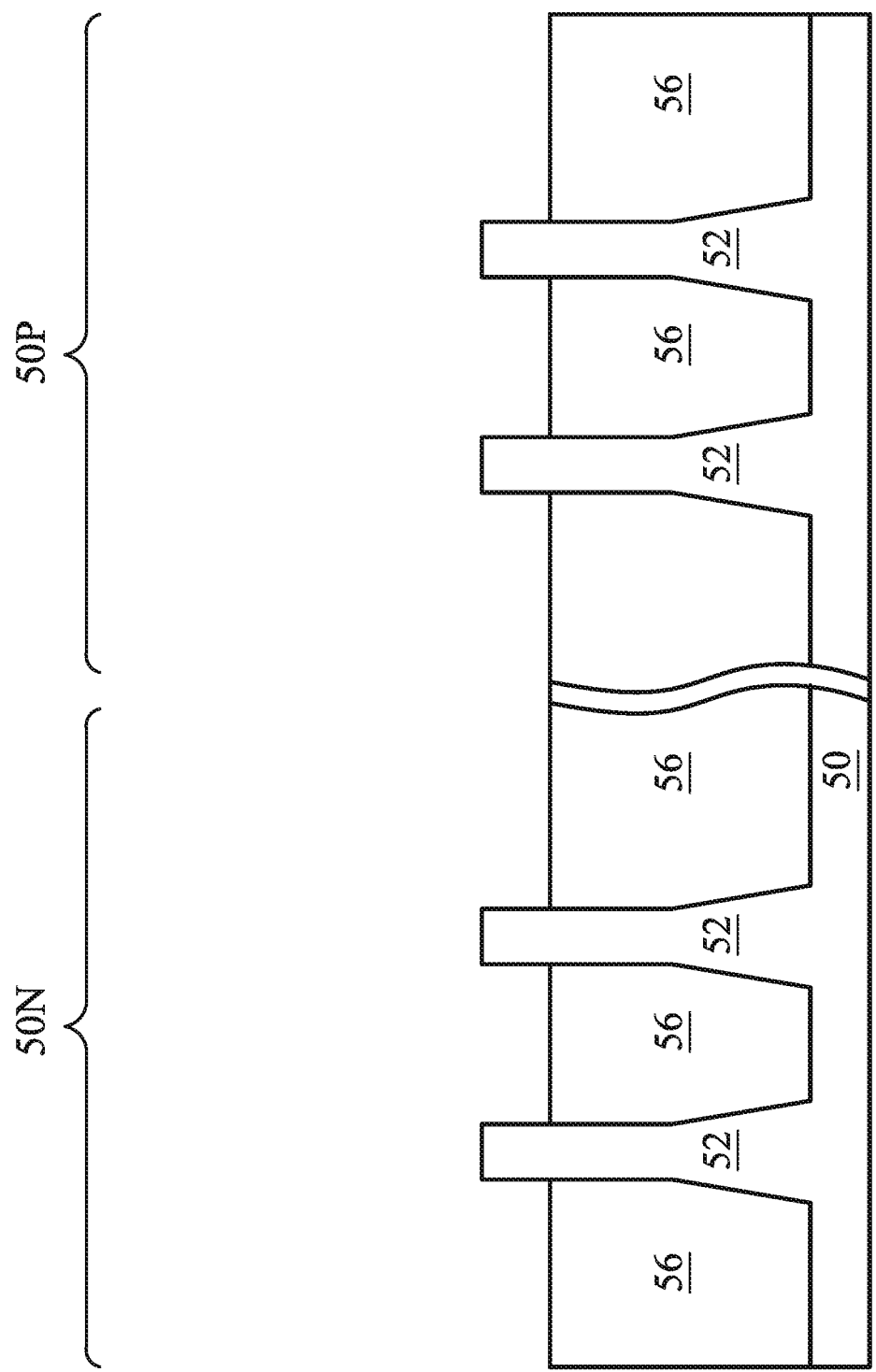

In FIGS. 8A and 8D, the insulation material 54 (see FIGS. 7A and 7D) is recessed to form shallow trench isolation (STI) regions 56. The insulation material 54 is recessed such that upper portions of fins 52 in the regions 50N and 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, a chemical oxide removal with a suitable etch process using, for example, dilute hydrofluoric (dHF) acid may be used.

The process described with respect to FIGS. 4A-8A is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins. For example, the fins 52 in FIG. 7A can be recessed, and a material different from the fins 52 may be epitaxially grown over the recessed fins 52. In such embodiments, the fins comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins. In some embodiments where homoepitaxial or heteroepitaxial structures are epitaxially grown, the epitaxially grown materials may be in situ doped during growth, which may obviate prior and subsequent implantations, although in situ and implantation doping may be used together.

Still further, it may be advantageous to epitaxially grow a material in the region 50N different from a material in the region 50P. In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 8A, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P. In the embodiments with different well types, the different implant steps for the region 50N and the region 50P may be achieved using a photoresist or other masks (not shown). For example, a first photoresist may be formed over the fins 52 and the STI regions 56 in both the region 50N and the region 50P. The first photoresist is patterned to expose the region 50P of the substrate 50. The first photoresist can be formed by using a spin-on technique and can be patterned using acceptable photolithography techniques. Once the first photoresist is patterned, an n-type impurity implantation is performed in the region 50P, while the remaining portion of the first photoresist acts as a mask to substantially prevent n-type impurities from being implanted into the region 50N. The n-type impurities may be phosphorus, arsenic, antimony, or the like, implanted in the region to a dose of equal to or less than $10^{15}$ cm$^{-2}$, such as between about $10^{12}$ cm$^{-2}$ and about $10^{15}$ cm$^{-2}$. In some embodiments, the n-type impurities may be implanted at an implantation energy of about 1 keV to about 10 keV. After the implantation, the first photoresist is removed, such as by an acceptable ashing process followed by a wet clean process.

Following the implantation of the region 50P, a second photoresist is formed over the fins 52 and the STI regions 56 in both the region 50P and the region 50N. The second photoresist is patterned to expose the region 50N of the substrate 50. The second photoresist can be formed by using a spin-on technique and can be patterned using acceptable photolithography techniques. Once the second photoresist is patterned, a p-type impurity implantation may be performed in the region 50N, while the remaining portion of the second photoresist acts as a mask to substantially prevent p-type impurities from being implanted into the region 50P. The p-type impurities may be boron, $BF_2$, indium, or the like, implanted in the region to a dose of equal to or less than $10^{15}$ $cm^{-2}$, such as between about $10^{12}$ $cm^{-2}$ and about $10^{15}$ $cm^{-2}$. In some embodiments, the p-type impurities may be implanted at an implantation energy of about 1 keV to about 10 keV. After the implantation, the second photoresist may be removed, such as by an acceptable ashing process followed by a wet clean process.

After performing the implantations of the region 50N and the region 50P, an anneal process may be performed to activate the p-type and/or n-type impurities that were implanted. In some embodiments, the grown materials of epitaxial fins may be in situ doped during growth, which may obviate the implantations, although in situ doping and implantation doping may be used together.

Figure 9A:
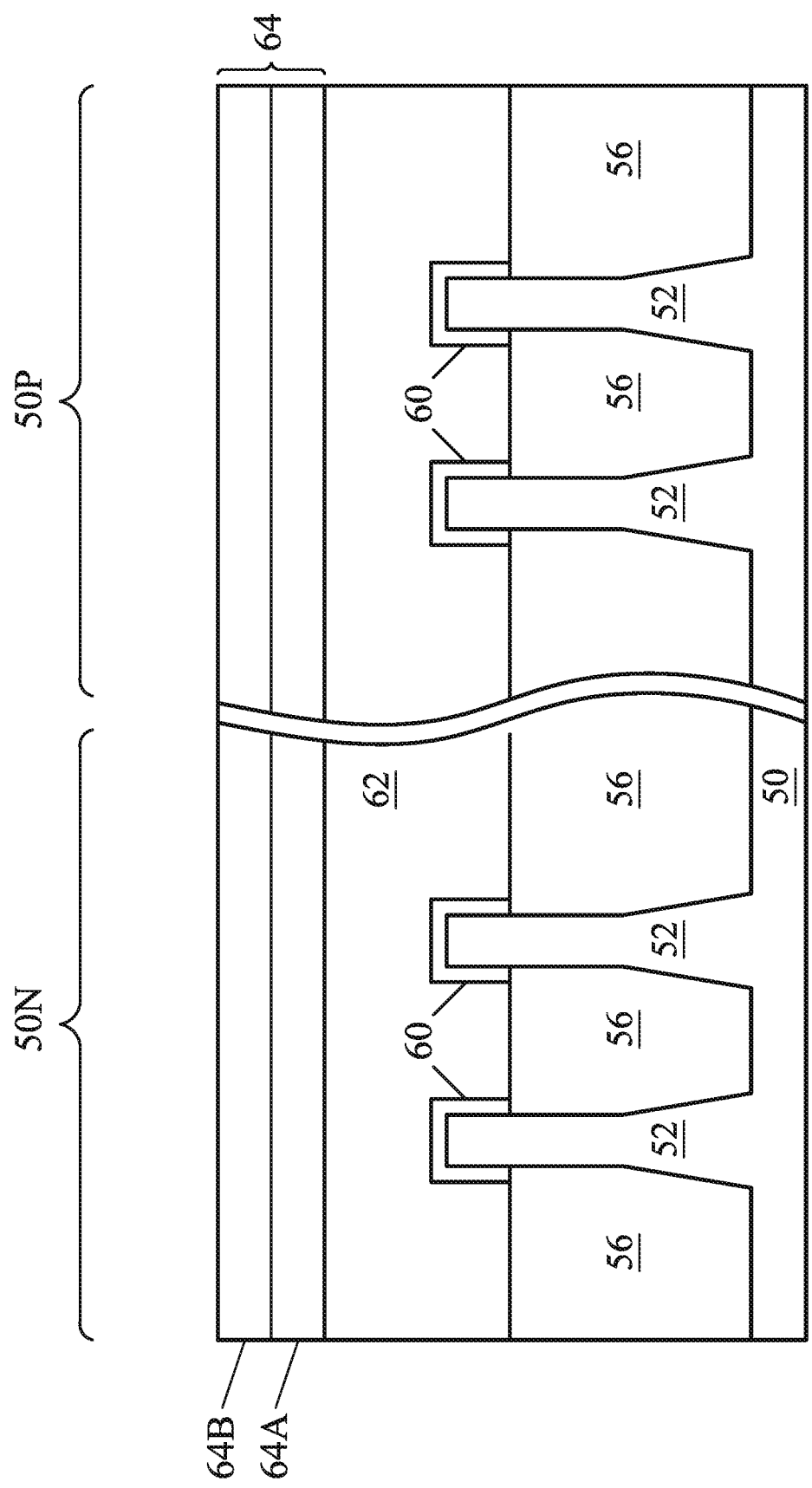

In FIGS. 9A and 9D, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60 and the STI regions 56 in the regions 50N, 50P and 50D, and a mask layer 64 is formed over the dummy gate layer 62 in the regions 50N, 50P and 50D. The dummy gate layer 62 may be deposited over the dummy dielectric layer 60 and the STI regions 56 and then planarized using, for example, a CMP process. The mask layer 64 may be deposited over the dummy gate layer 62.

The dummy gate layer 62 may be a conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity than materials of the STI regions 56. The dummy gate layer 62 may also be referred to as a sacrificial gate layer or a sacrificial gate electrode layer.

The mask layer 64 may include, for example, one or more layers of silicon oxide, SiN, SiON, a combination thereof, or the like. In some embodiments, the mask layer 64 comprises a first mask layer 64A and a second mask layer 64B over the first mask layer 64A. In some embodiments, the first mask layer 64A and the second mask layer 64B comprise different materials. In some embodiments, the first mask layer 64A comprises a nitride material, such as silicon nitride, or the like. In some embodiments, the second mask layer 64B comprises an oxide material, such as silicon oxide, or the like. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56 in the regions 50N, 50P and 50D, extending between the dummy gate layer 62 and the STI regions 56.

FIGS. 10A, 10B, 10D, 11A, 11B, 11D, 12A, 12B, 12D, 13A, 13B, 13D, 14A, 14B, 14D, 15C, 16C, 17A, 17B, 17D, 18A, 18B, 18D, 19A, 19B, 19D, 20A, 20B, 20D, 21B, 22A, 22B, 22D, 23A, 23B, and 23D illustrate various additional steps in the manufacturing of a FinFET device and an alignment structure in accordance with some embodiments. FIGS. 10A, 10B, 11A, 11B, 12A, 12B, 13A, 13B, 14A, 14B, 15C, 16C, 17A, 17B, 18A, 18B, 19A, 19B, 20A, 20B, 21B, 22A, 22B, 23A, and 23B illustrate features in either of the region 50N and the region 50P. For example, the structures illustrated in FIGS. 10A, 10B, 11A, 11B, 12A, 12B, 13A, 13B, 14A, 14B, 15C, 16C, 17A, 17B, 18A, 18B, 19A, 19B, 20A, 20B, 21B, 22A, 22B, 23A, and 23B may be applicable to both the region 50N and the region 50P. Differences (if any) in the structures of the region 50N and the region 50P are described in the text accompanying each figure.

In FIGS. 10A, 10B, 10D, 11A, 11B, 11D, 12A, 12B, and 12D, the sacrificial gates 72 are formed in the regions 50N, 50P and 50D. As described below in greater detail, in some embodiments, the sacrificial gates 72 in the regions 50N, 50P and 50D are subsequently replaced by replacement gates. Replacement gates in the regions 50N and 50P are active gates of the FinFET device. Replacement gates in the regions 50D are dummy gates and form an alignment structure 105, which is subsequently used to align various features of the FinFET device with each other. In other embodiments, the sacrificial gates 72 in the region 50D are not replaced by respective replacement gates. In such embodiments, the sacrificial gates 72 in the region 50D form the alignment structure 105.

Figure 10B:
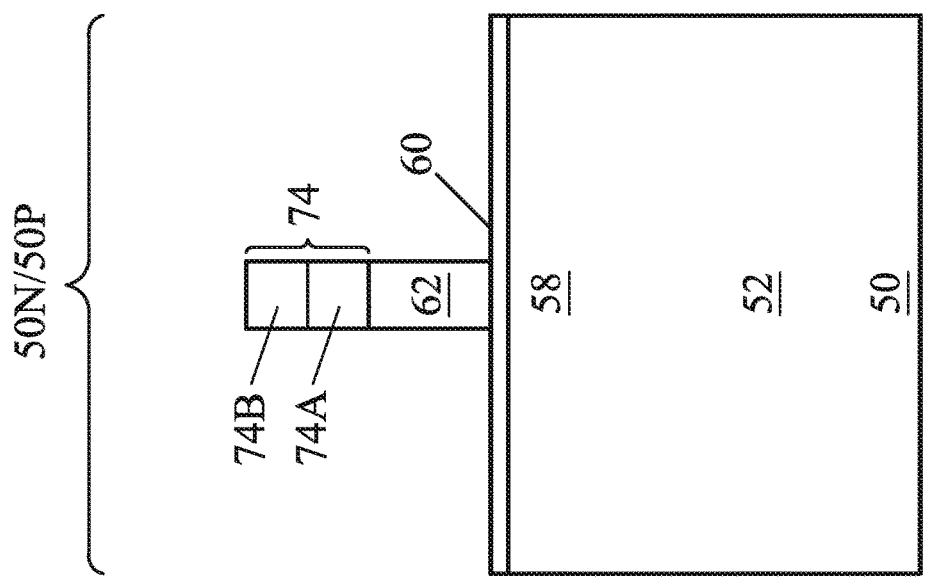
Figure 10A:
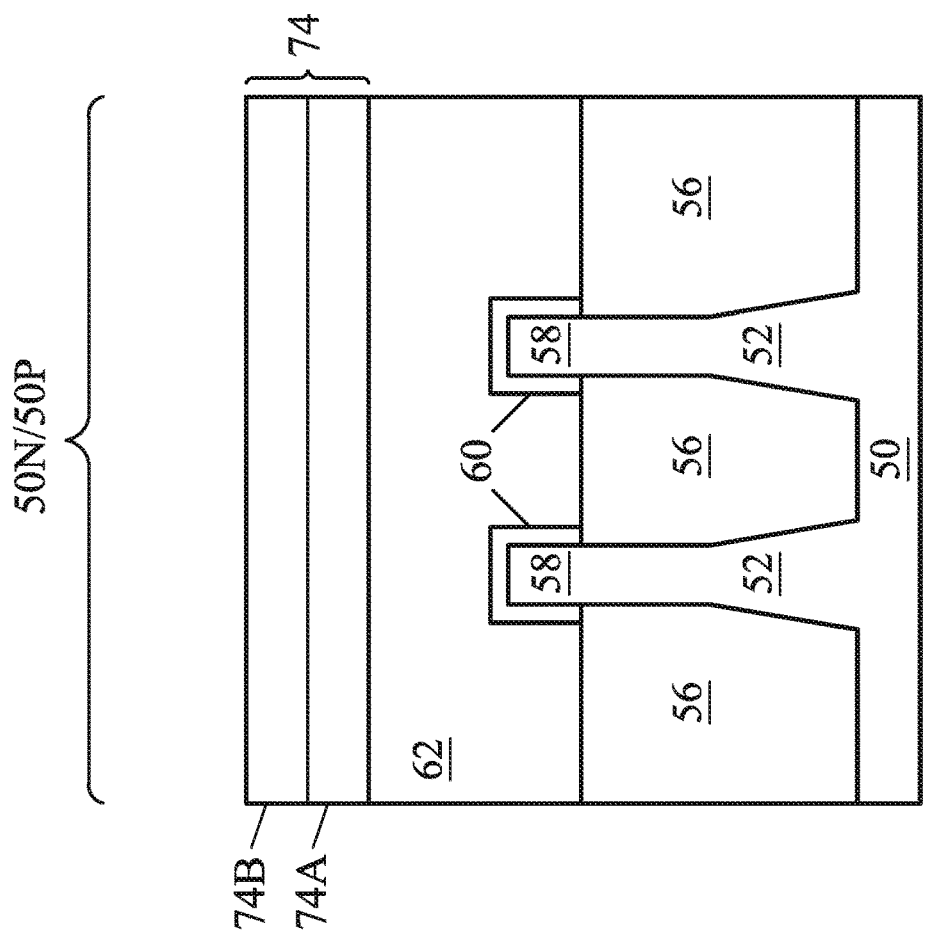
Figure 10D:
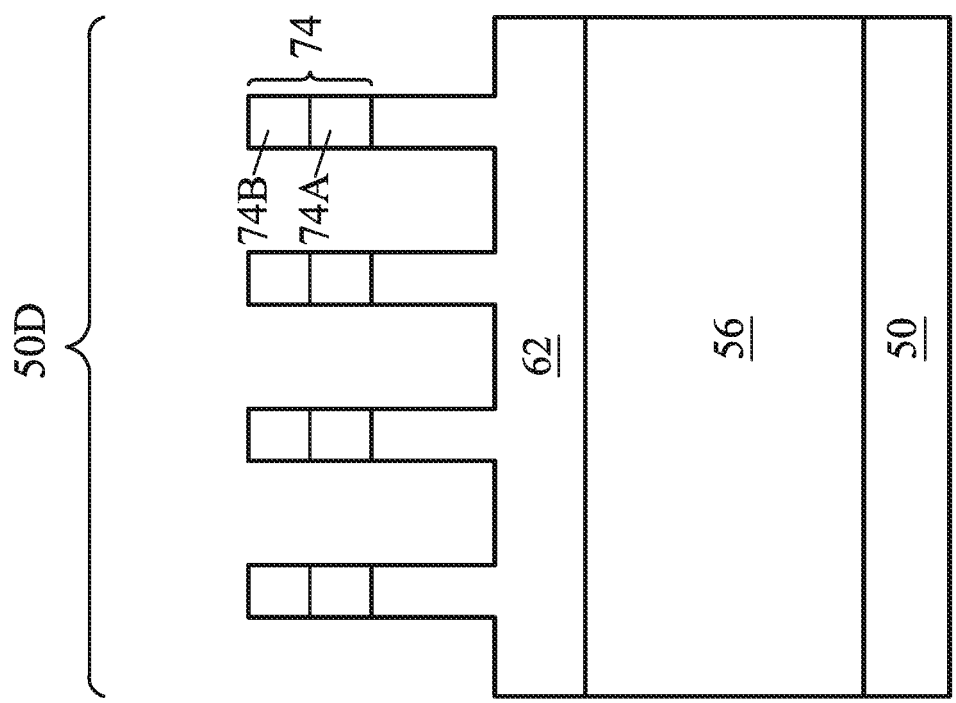

In FIGS. 10A, 10B, and 10D, the mask layer 64 (see FIGS. 9A, 9B, and 9D) is patterned using acceptable photolithography and etching techniques to form masks 74. In some embodiments, the etching techniques may include one or more anisotropic etch processes such as a reactive ion etch (RIE), neutral beam etch (NBE), a combination thereof, or the like. In some embodiments, the mask layer 64 is patterned using a dry etch process using an etchant gas mixture comprising $CF_4$, or the like. In some embodiments, the dry etch process is performed at a pressure between about 2 mtorr to about 800 mtorr. In some embodiments when the etchant gas mixture comprises $CF_4$, a flow rate of $CF_4$ is between about 5 sccm to 250 sccm.

Subsequently, the pattern of the masks 74 may be transferred to the dummy gate layer 62 to form sacrificial gates 72. In some embodiments, the pattern of the masks 74 may also be transferred to the dummy dielectric layer 60 by an acceptable patterning process. In some embodiments, the patterning process comprises a plurality of etch processes. In some embodiments, the patterning process comprises a first etch process, a second etch process and a third etch process. In some embodiments, the first etch process etches the dummy gate layer 62 to a depth that is substantially level with the top surfaces of the fins 52. In some embodiments, the first etch process comprises a first dry etch process using an etchant gas mixture comprising HBr, $Cl_2$, a combination thereof, or the like. In some embodiments, the first dry etch process is performed at a pressure between about 2 mtorr to about 800 mtorr. In some embodiments when the etchant gas mixture comprises HBr, a flow rate of HBr is between about 10 sccm to 800 sccm. In some embodiments when the etchant gas mixture comprises Cl$_2$, a flow rate of Cl$_2$ is between about 10 sccm to 800 sccm.

Figure 11B:
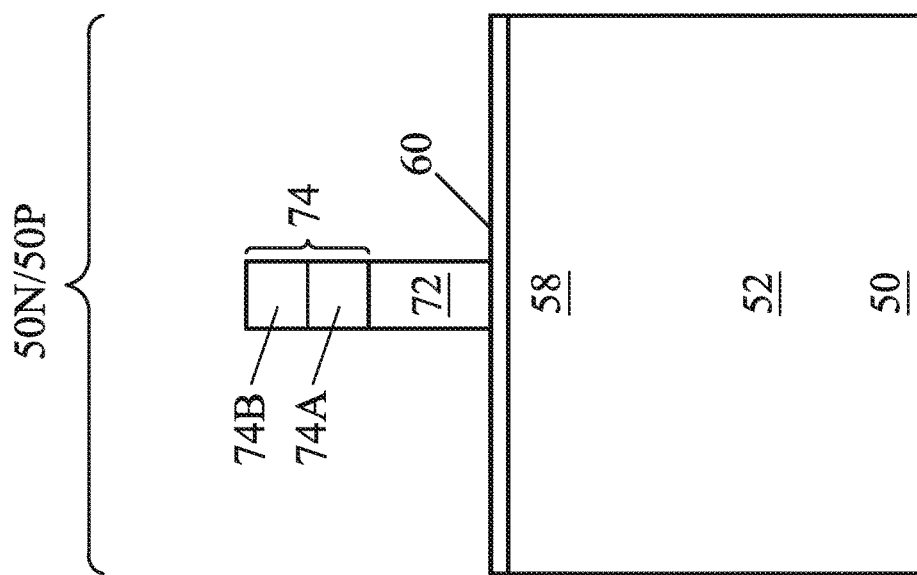
Figure 11A:
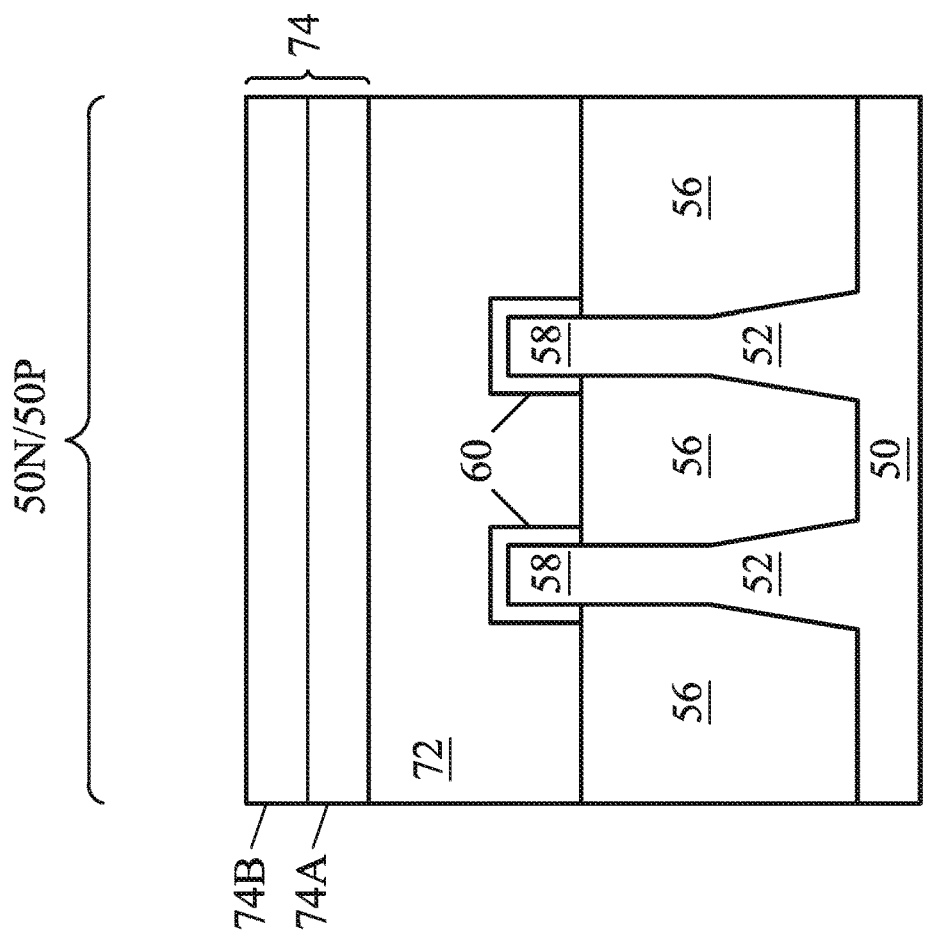
Figure 11D:
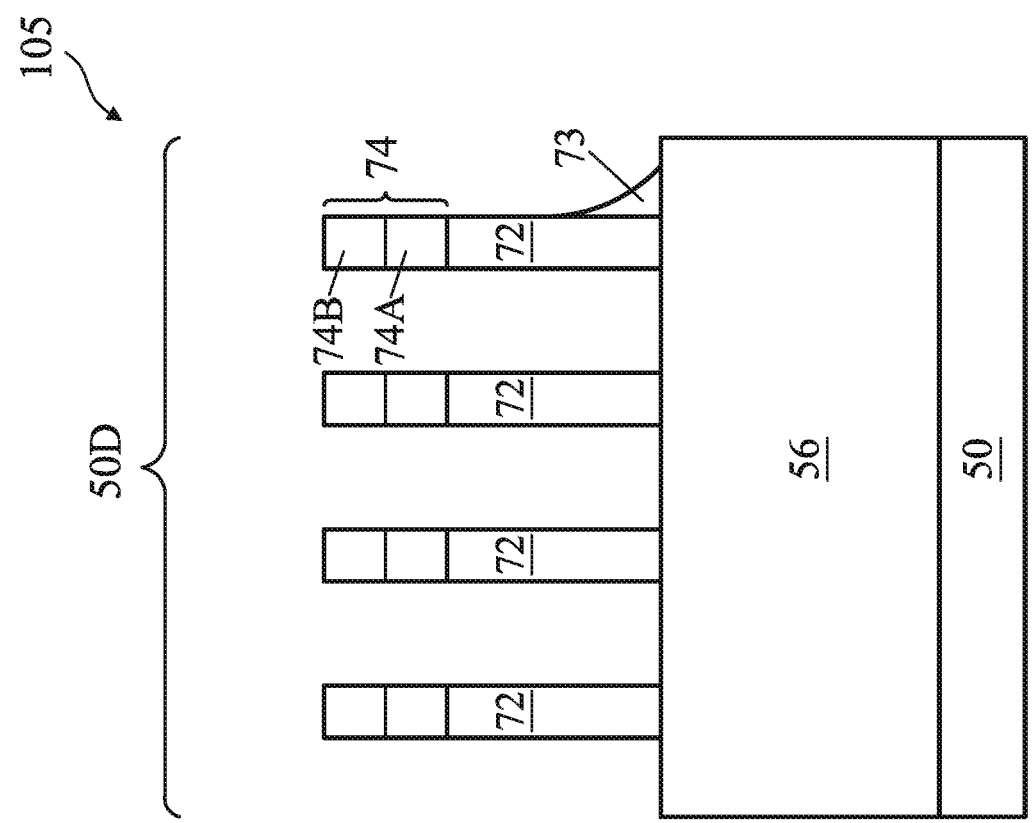

In FIGS. 11A, 11B, and 11D, after performing the first etch process, the second etch process is performed on the dummy gate layer 62 (see FIGS. 10A, 10B, and 10D). In some embodiments, the second etch process exposes a top surface of the STI region 56 and separates adjacent sacrificial gates 72 from one another. In some embodiments, the second etch process comprises a second dry etch process using an etchant gas mixture comprising HBr, O$_2$, N$_2$, CF$_4$, a combination thereof, or the like. In some embodiments, the second dry etch process is performed at a pressure between about 40 mtorr to about 100 mtorr. In some embodiments when the etchant gas mixture comprises HBr, a flow rate of HBr is between about 200 sccm to 500 sccm. In some embodiments when the etchant gas mixture comprises O$_2$, a flow rate of O$_2$ is between about 20 sccm to 40 sccm. In some embodiments when the etchant gas mixture comprises N$_2$, a flow rate of N$_2$ is between about 20 sccm to 50 sccm. In some embodiments when the etchant gas mixture comprises CF$_4$, a flow rate of CF$_4$ is between about 20 sccm to 50 sccm. In some embodiments, byproducts of the first etch process may form footing features 73 on outer sidewalls of the sacrificial gates 72 that are disposed at the edge of subsequently formed alignment structure in the region 50D. In some embodiments, the footing features 73 are formed at interfaces between the sacrificial gates 72 and respective STI regions 56. In some embodiments, the footing features 73 may comprise a polymer material formed from the byproducts of the first etch process.

Figure 12B:
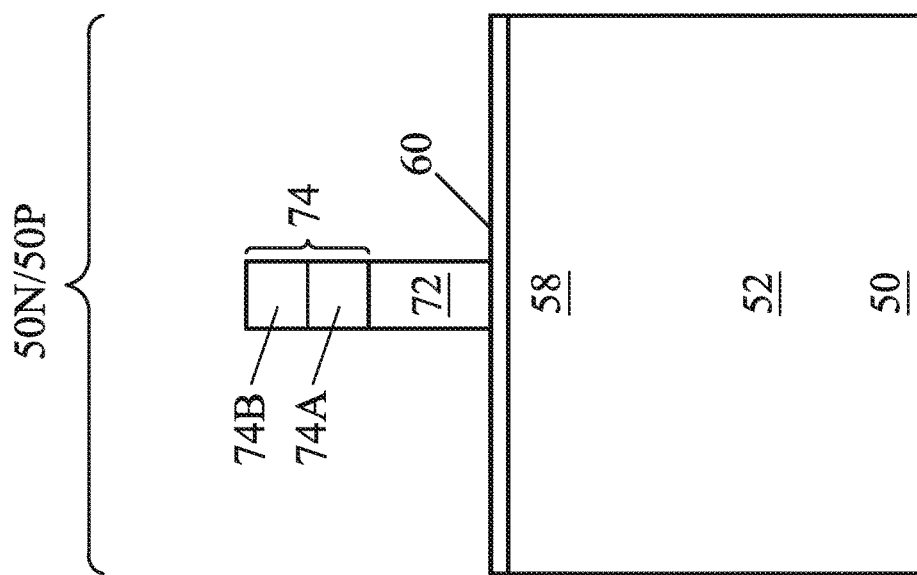
Figure 12A:
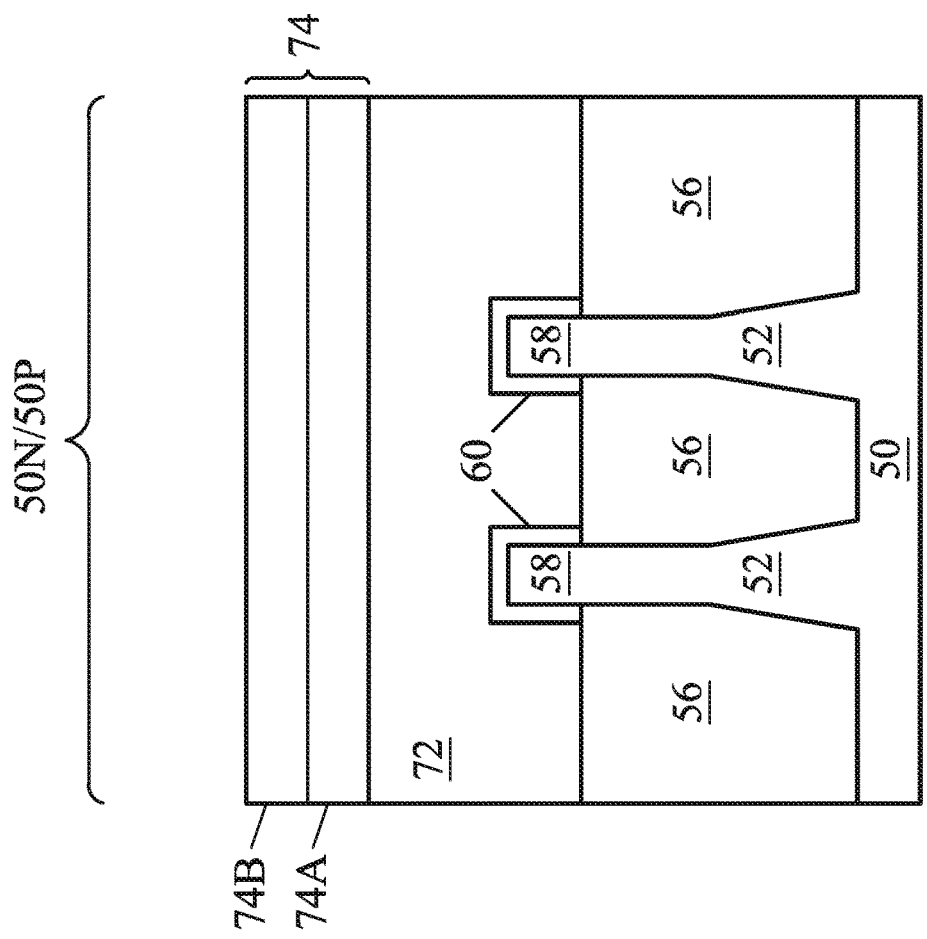
Figure 12D:
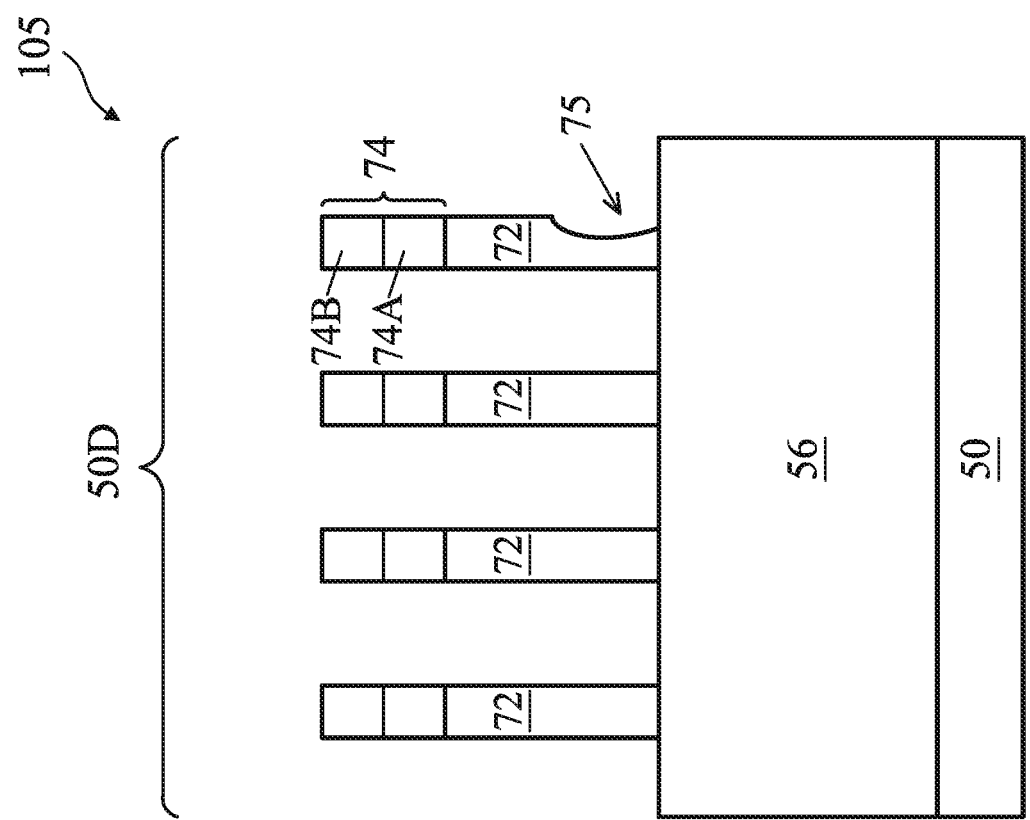

In FIGS. 12A, 12B, and 12D, after performing the second etch process, the third etch process is performed on the sacrificial gates 72. In some embodiments, the third etch process reshapes the sacrificial gates 72 in the region 50D. In some embodiments, the third etch process removes the footing features 73 and forms notches 75 at locations of the footing features 73. In some embodiments, the notches 75 extend into the respective sacrificial gates 72 and have curved sidewalls. In some embodiments, the third etch process comprises a third dry etch process using an etchant gas mixture comprising HBr, O$_2$, N$_2$, Cl$_2$, NF$_3$, a combination thereof, or the like. In some embodiments, the third dry etch process is performed at a pressure between about 40 mtorr to about 100 mtorr. In some embodiments when the etchant gas mixture comprises HBr, a flow rate of HBr is between about 200 sccm to 500 sccm. In some embodiments when the etchant gas mixture comprises O$_2$, a flow rate of O$_2$ is between about 20 sccm to 40 sccm. In some embodiments when the etchant gas mixture comprises N$_2$, a flow rate of N$_2$ is between about 20 sccm to 50 sccm. In some embodiments when the etchant gas mixture comprises Cl$_2$, a flow rate of Cl$_2$ is between about 10 sccm to 200 sccm. In some embodiments when the etchant gas mixture comprises NF$_3$, a flow rate of NF$_3$ is between about 10 sccm to 30 sccm.

Figure 13B:
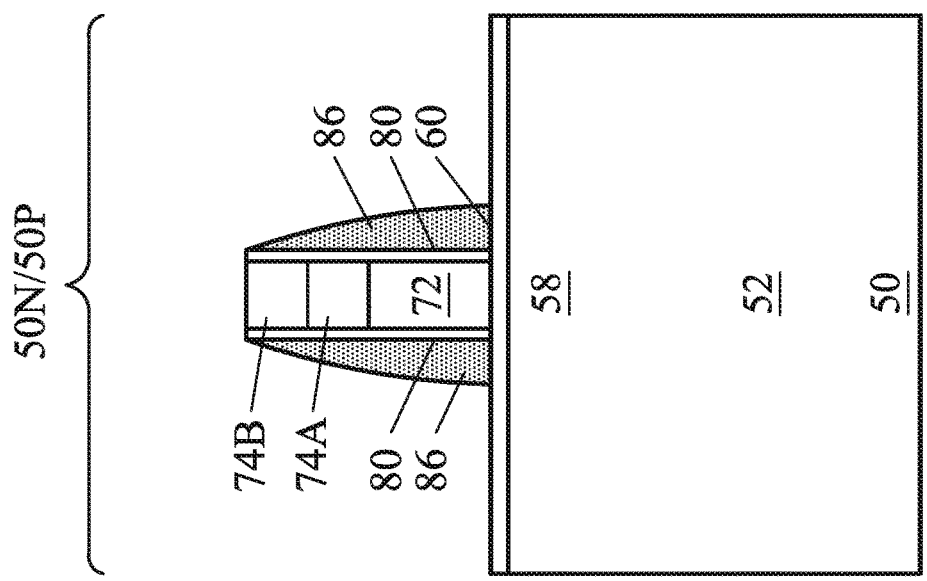
Figure 13A:
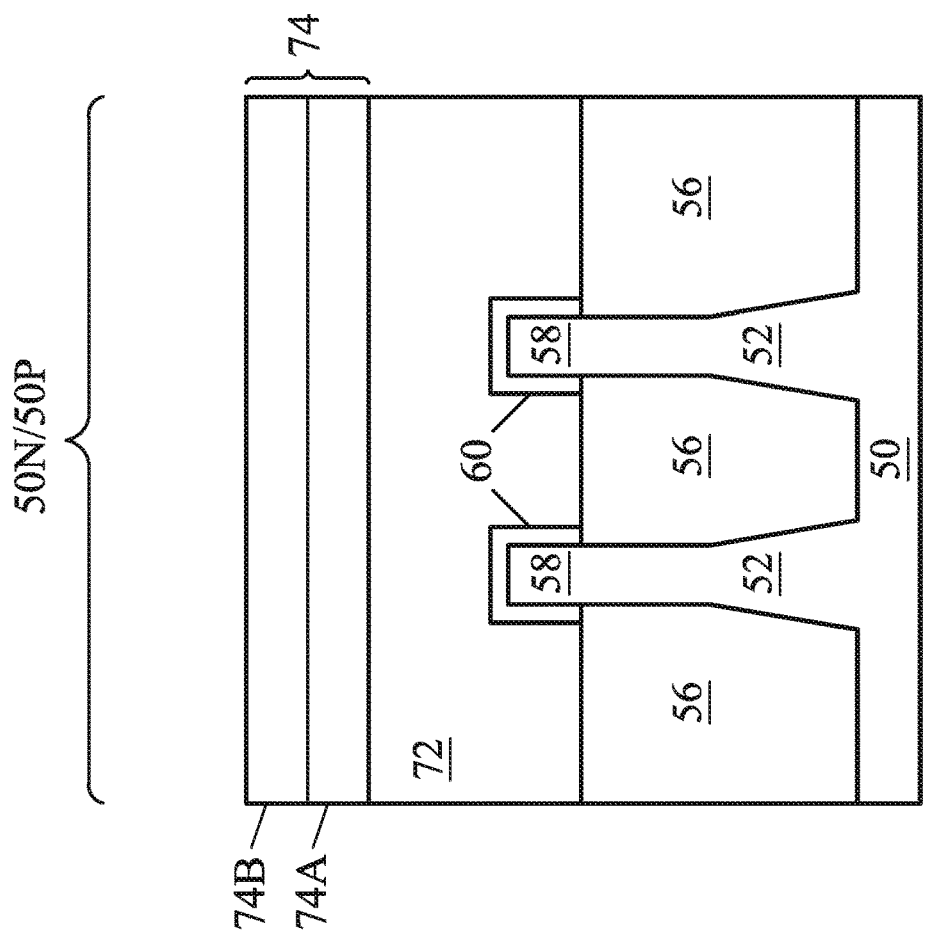
Figure 13D:
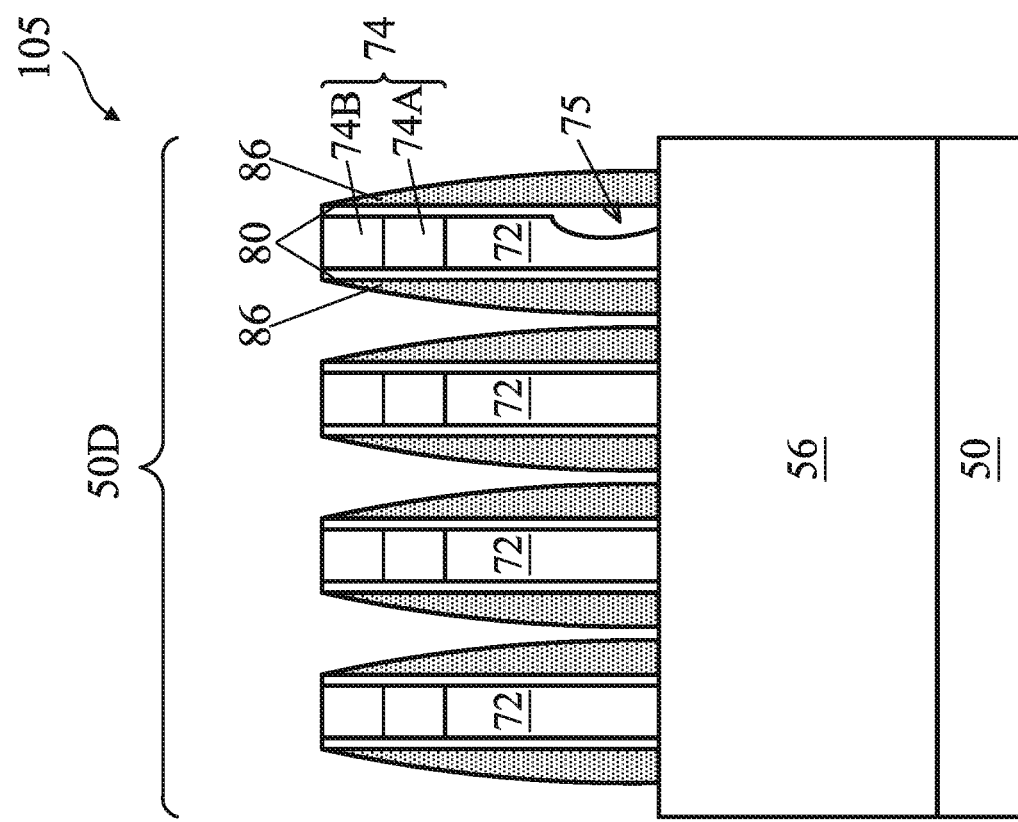

In FIGS. 13A, 13B, and 13D, gate seal spacers 80 may be formed on exposed surfaces of the sacrificial gates 72, the masks 74, and/or the fins 52 in regions 50N, 50P and 50D. A thermal oxidation or a deposition followed by an anisotropic etch may form the gate seal spacers 80. The gate seal spacers 80 may comprise silicon oxide, silicon nitride, SiCN, SiOC, SiOCN, a combination thereof, or the like. In some embodiments, the gate seal spacers 80 may fill the notches 75 of the sacrificial gates 72 in the region 50D. After the formation of the gate seal spacers 80, implants for lightly doped source/drain (LDD) regions (not explicitly illustrated) may be performed. In the embodiments with different device types, similar to the implants discussed above in FIG. 8A, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P, while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a dose of impurities of from about $10^{12}$ cm$^{-2}$ to about $10^{16}$ cm$^{-2}$. In some embodiments, the suitable impurities may be implanted at an implantation energy of about 1 keV to about 10 keV. An anneal may be used to activate the implanted impurities.

Further in FIGS. 13A, 13B, and 13D, gate spacers 86 are formed on the gate seal spacers 80 along sidewalls of the sacrificial gates 72 and the masks 74 in the regions 50N, 50P and 50D. The gate spacers 86 may be formed by conformally depositing an insulating material and subsequently anisotropically etching the insulating material. The insulating material of the gate spacers 86 may comprise silicon oxide, silicon nitride, SiCN, SiOC, SiOCN, a combination thereof, or the like. In some embodiments, the gate spacers 86 may comprise a plurality of layers (not shown), such that the layers comprise different materials.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like). Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 14B:
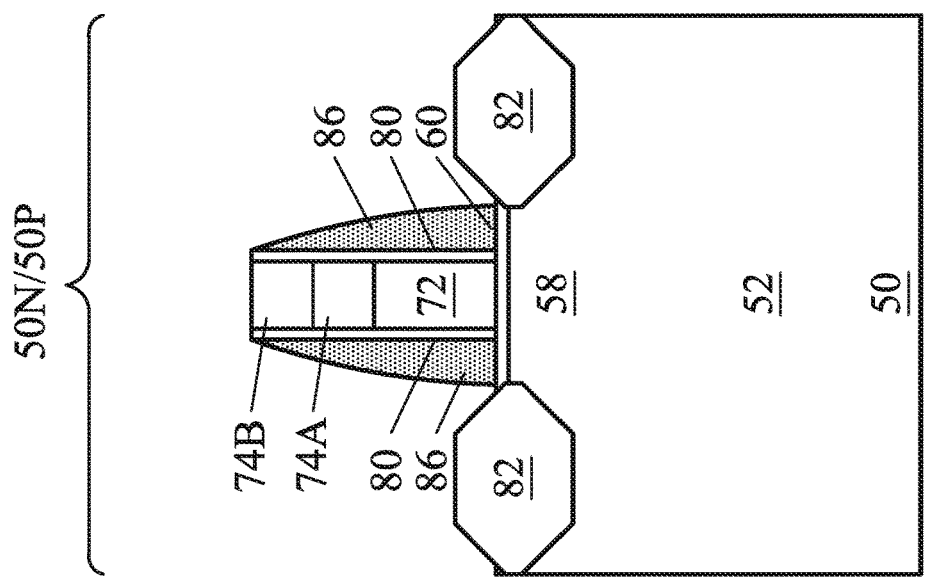
Figure 14A:
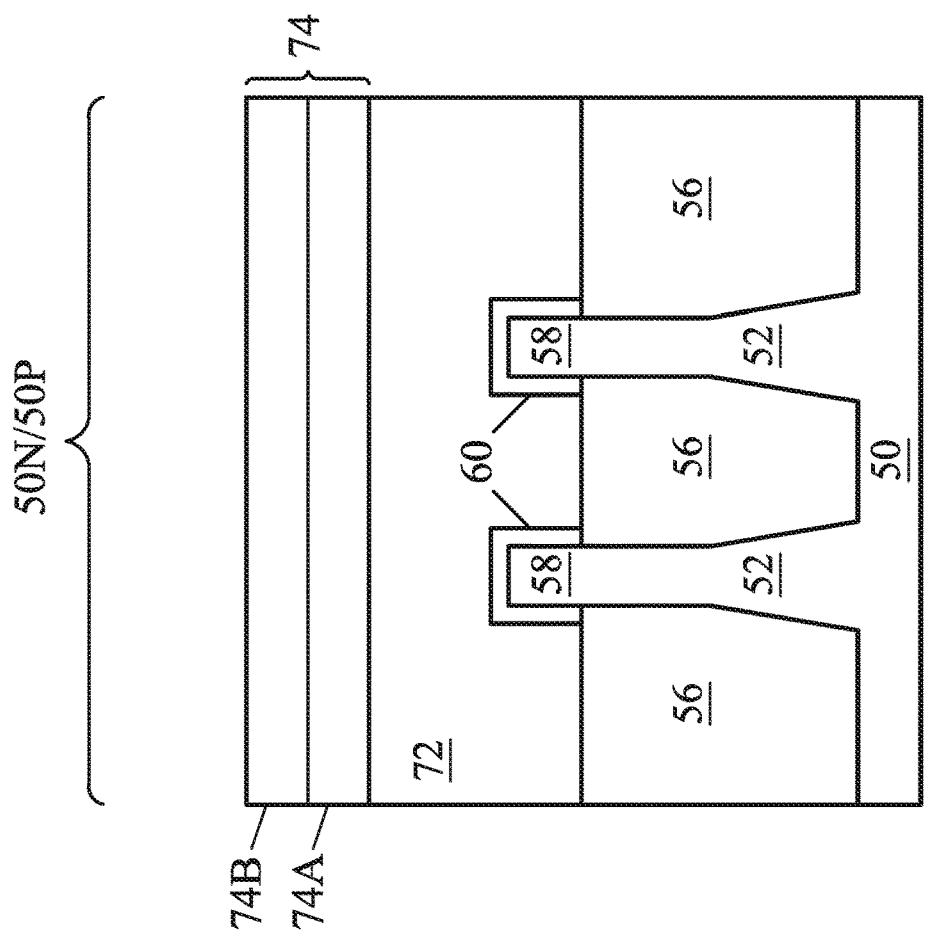
Figure 14D:
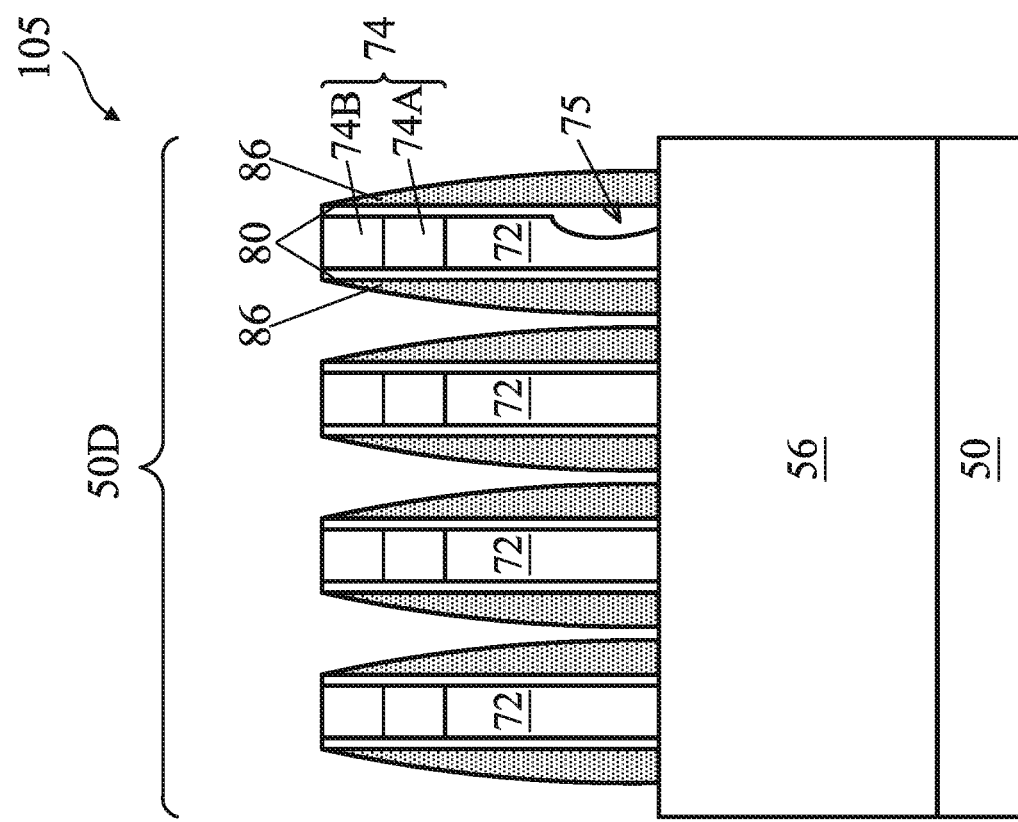
Figure 15C:
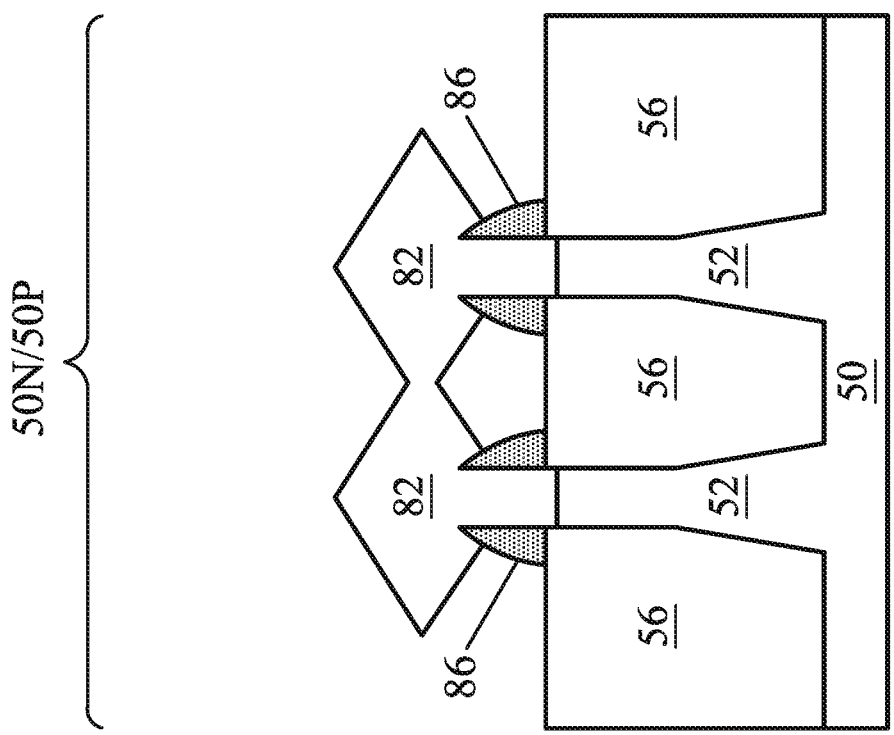

In FIGS. 14A, 14B, and 14D, epitaxial source/drain regions 82 are formed in the fins 52 to exert stress in the respective channel regions 58, thereby improving device performance. The epitaxial source/drain regions 82 are formed in the fins 52 such that each sacrificial gate 72 is disposed between respective neighboring pairs of the epitaxial source/drain regions 82. In some embodiments, the epitaxial source/drain regions 82 may extend into, and may also penetrate through, the fins 52. In some embodiments, the gate spacers 86 are used to separate the epitaxial source/drain regions 82 from the sacrificial gates 72 by an appropriate lateral distance so that the epitaxial source/drain regions 82 do not short out subsequently formed gates of the resulting FinFET device.

The epitaxial source/drain regions 82 in the region 50N may be formed by masking the region 50P and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, SiC, SiCP, SiP, a combination thereof, or the like. The epitaxial source/drain regions 82 in the region 50N may have surfaces raised from respective surfaces of the fins 52 and may have facets.

The epitaxial source/drain regions 82 in the region 50P may be formed by masking the region 50N and etching source/drain regions of the fins 52 in the region 50P to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as SiGe, SiGeB, Ge, GeSn, a combination thereof, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The epitaxial source/drain regions 82 may have an impurity concentration of between about $10^{19}$ cm$^{-3}$ and about $10^{21}$ cm$^{-3}$. The n-type and/or p-type impurities for the epitaxial source/drain regions 82 may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent epitaxial source/drain regions 82 of a same FinFET to merge as illustrated by FIG. 15C. In other embodiments, adjacent epitaxial source/drain regions 82 remain separated after the epitaxy process is completed as illustrated by FIG. 16C. In the embodiments illustrated in FIGS. 15C and 16C, the gate spacers 86 are formed covering a portion of the sidewalls of the fins 52 that extend above the STI regions 56 thereby blocking the epitaxial growth. In other embodiments, the spacer etch used to form the gate spacers 86 may be adjusted to remove the spacer material from the sidewalls of the fins 52 to allow the epitaxially grown region to extend to the surface of the STI region 56.

Figure 17D:
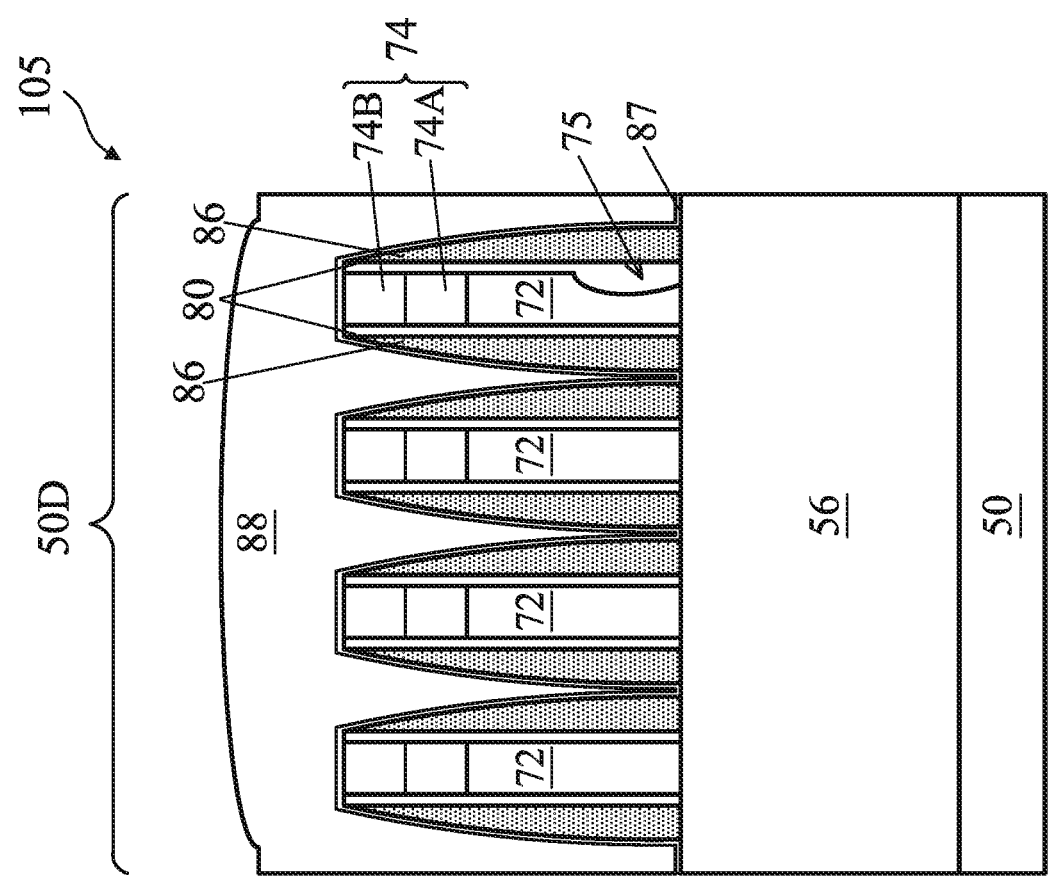

In FIGS. 17A, 17B and 17D, a first ILD 88 is deposited over the structure illustrated in FIGS. 14A, 14B and 14D in the regions 50N, 50P and 50D. The first ILD 88 may be formed of a dielectric material, and may be deposited by any suitable method, such as CVD, plasma-enhanced CVD (PECVD), FCVD, a combination thereof, or the like. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be also used. In some embodiments, a contact etch stop layer (CESL) 87 is disposed between the first ILD 88 and the epitaxial source/drain regions 82, the masks 74, and the gate spacers 86 in the regions 50N, 50P and 50D. The CESL 87 may comprise a dielectric material, such as, silicon nitride, silicon oxide, silicon oxynitride, a combination thereof, or the like, having a different etch rate than the material of the overlying first ILD 88.

Figure 18B:
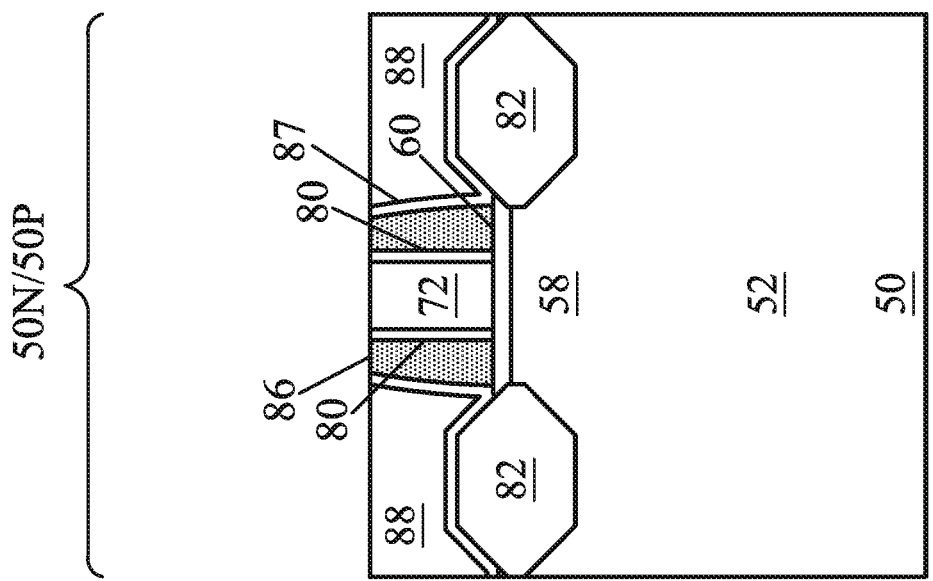
Figure 18A:
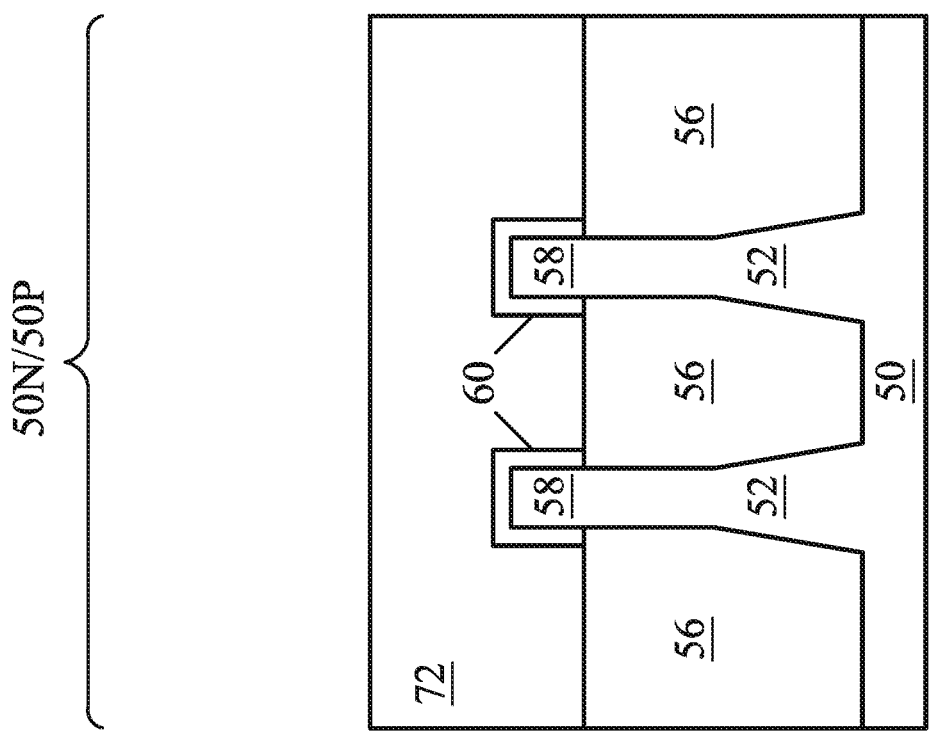

In FIGS. 18A, 18B and 18D, a planarization process, such as a CMP process, may be performed to level the top surface of the first ILD 88 with the top surfaces of the sacrificial gates 72 or the masks 74 (see FIGS. 17A, 17B and 17D) in the regions 50N, 50P and 50D. The planarization process may also remove the masks 74 on the sacrificial gates 72, and portions of the gate seal spacers 80 and the gate spacers 86 along sidewalls of the masks 74. After the planarization process, top surfaces of the sacrificial gates 72, the gate seal spacers 80, the gate spacers 86, and the first ILD 88 are level with each other. Accordingly, the top surfaces of the sacrificial gates 72 are exposed through the first ILD 88. In some embodiments, the masks 74 may remain, in which case the planarization process levels the top surface of the first ILD 88 with the top surfaces of the masks 74.

Figure 19B:
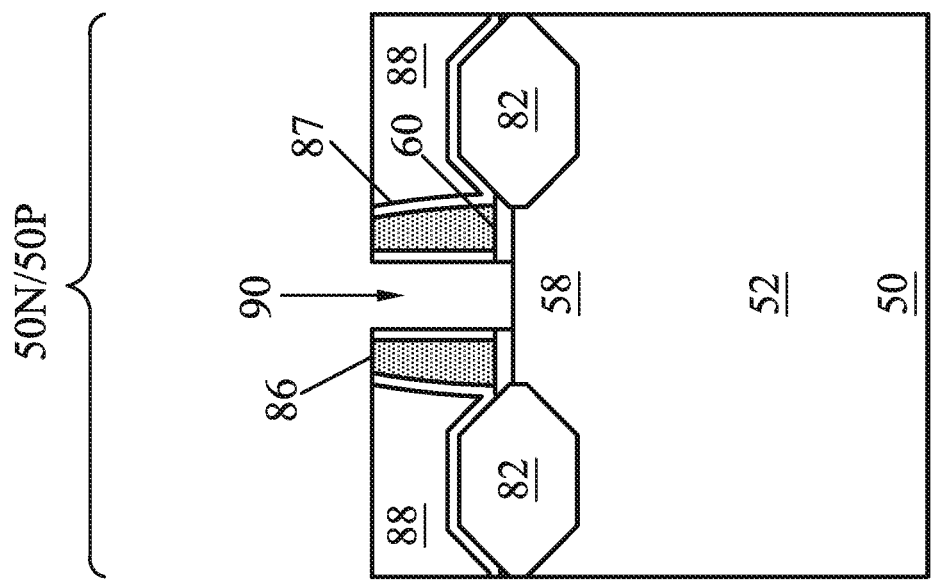
Figure 19A:
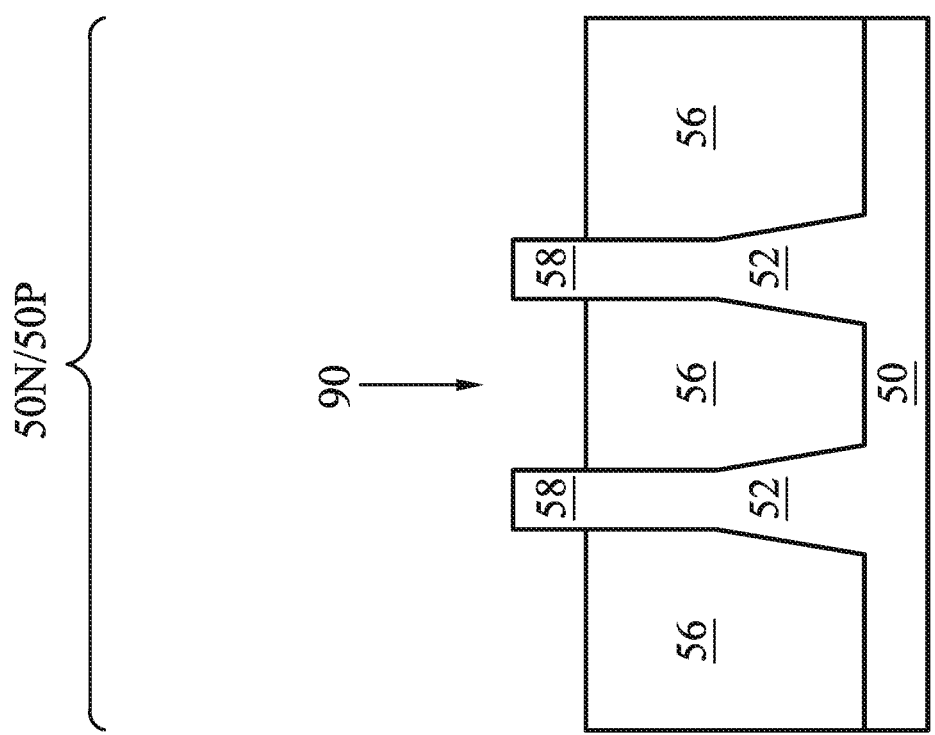
Figure 19D:
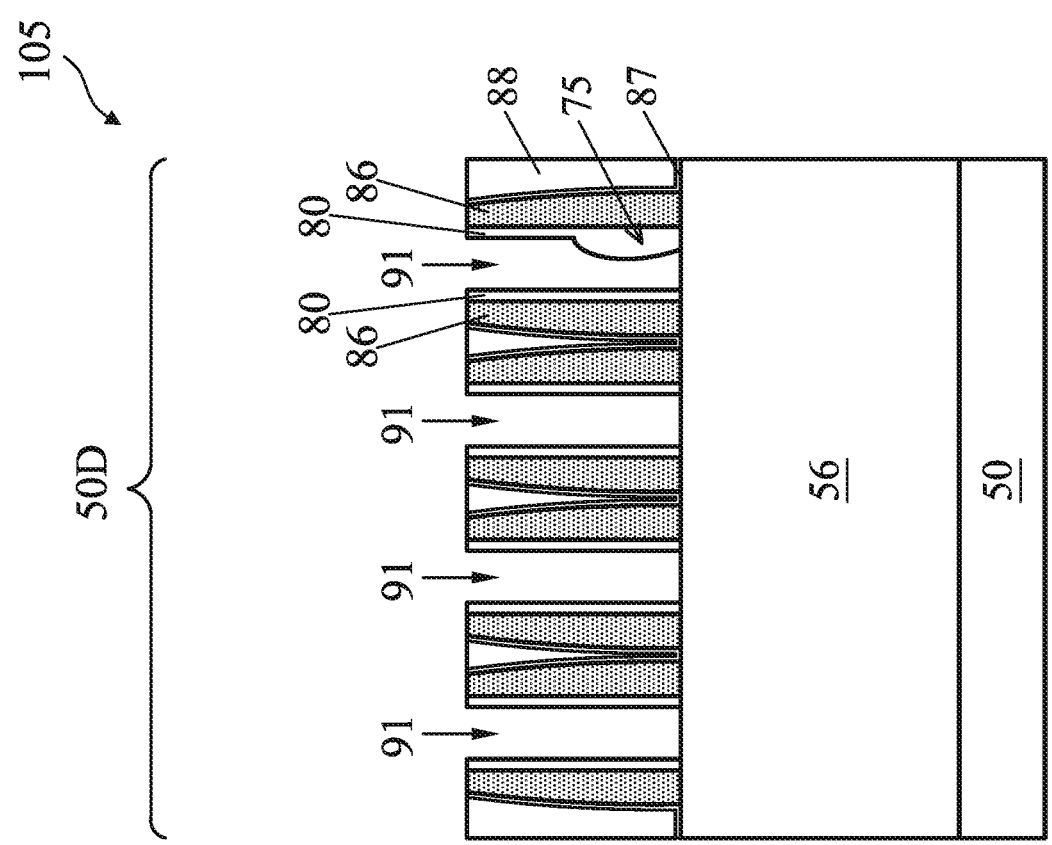

In FIGS. 19A, 19B and 19D, the sacrificial gates 72, and the masks 74, if present, in the regions 50N and 50P are removed in an etching step(s), so that openings 90 are formed in the regions 50N and 50P, and openings 91 are formed in the region 50D. Portions of the dummy dielectric layer 60 in the openings 90 may also be removed. In some embodiments, only the sacrificial gates 72 are removed and the dummy dielectric layer 60 remains and is exposed by the openings 90. In some embodiments, the dummy dielectric layer 60 is removed from the openings 90 in a first region of a die (e.g., a core logic region) and remains in openings 90 in a second region of the die (e.g., an input/output region). In some embodiments, the sacrificial gates 72 are removed by an anisotropic dry etch process. For example, the etching process may include a dry etch process using reaction gas(es) that selectively etch the sacrificial gates 72 without etching the first ILD 88 or the gate spacers 86. Each opening 90 exposes a channel region 58 of a respective fin 52. Each channel region 58 is disposed between neighboring pairs of the epitaxial source/drain regions 82. During the removal, the dummy dielectric layer 60 may be used as an etch stop layer when the sacrificial gates 72 are etched. The dummy dielectric layer 60 may then be optionally removed after the removal of the sacrificial gates 72.

Figure 20B:
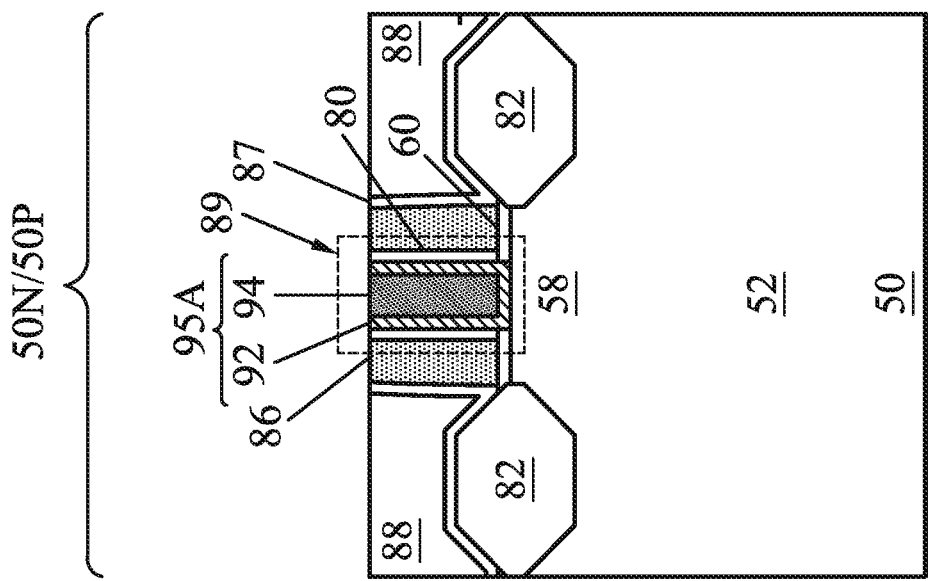
Figure 20A:
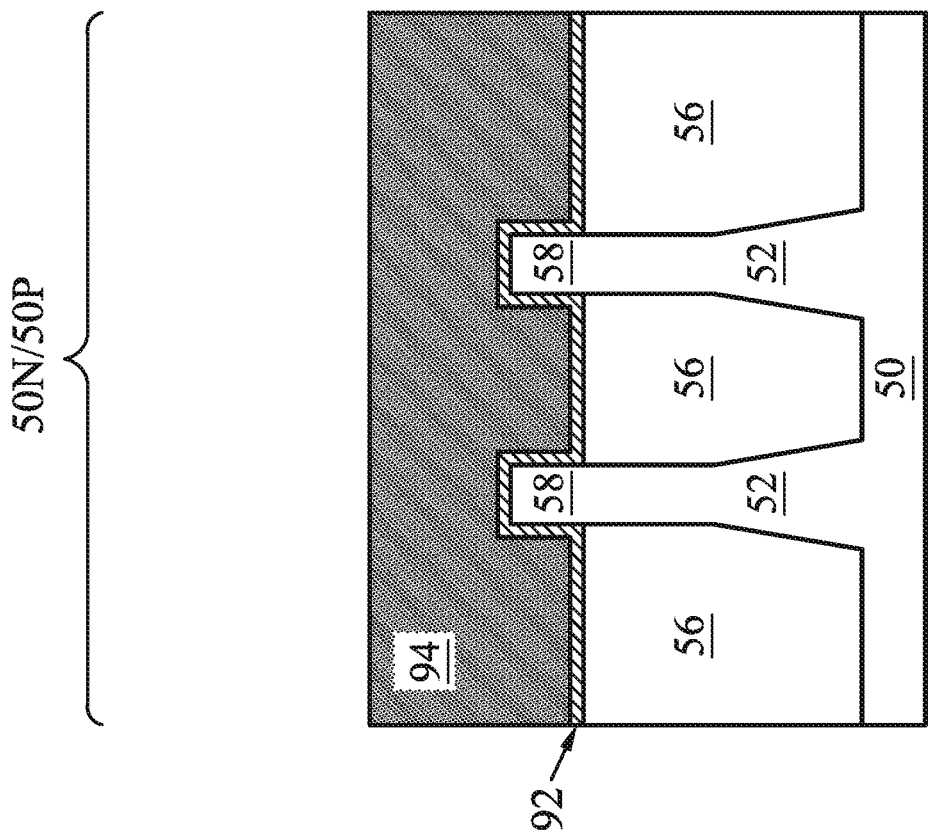
Figure 20D:
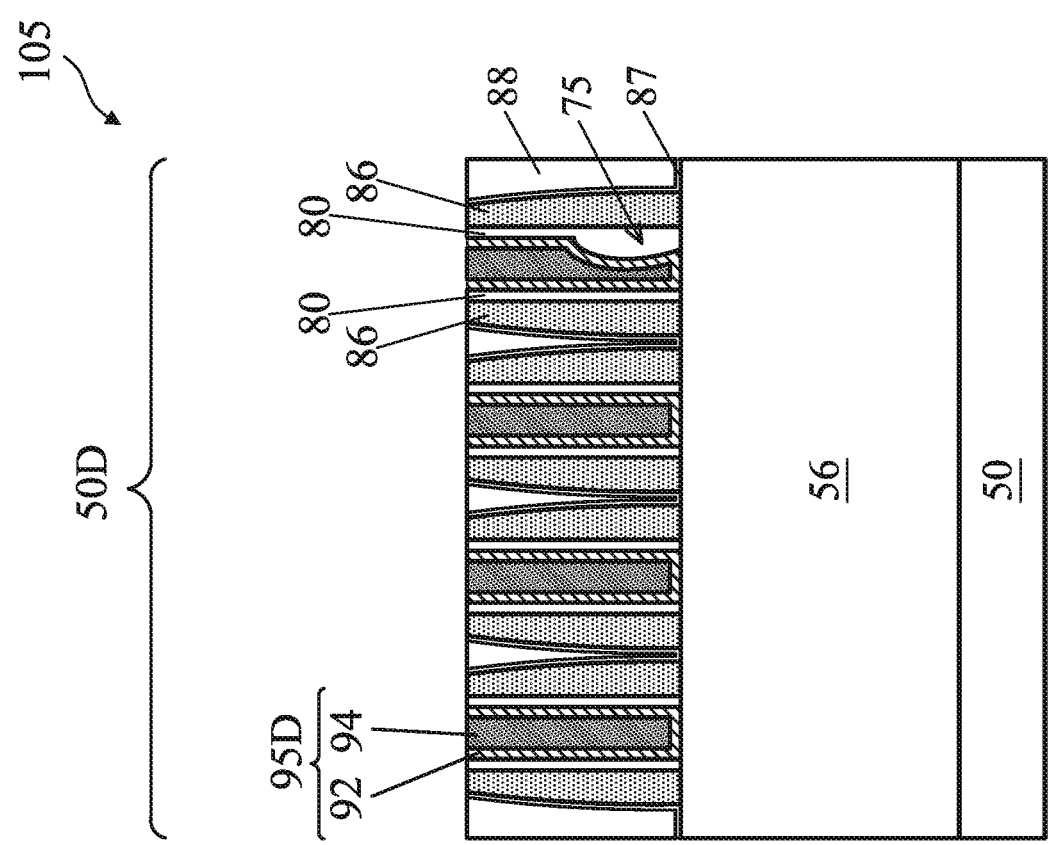
Figure 21B:
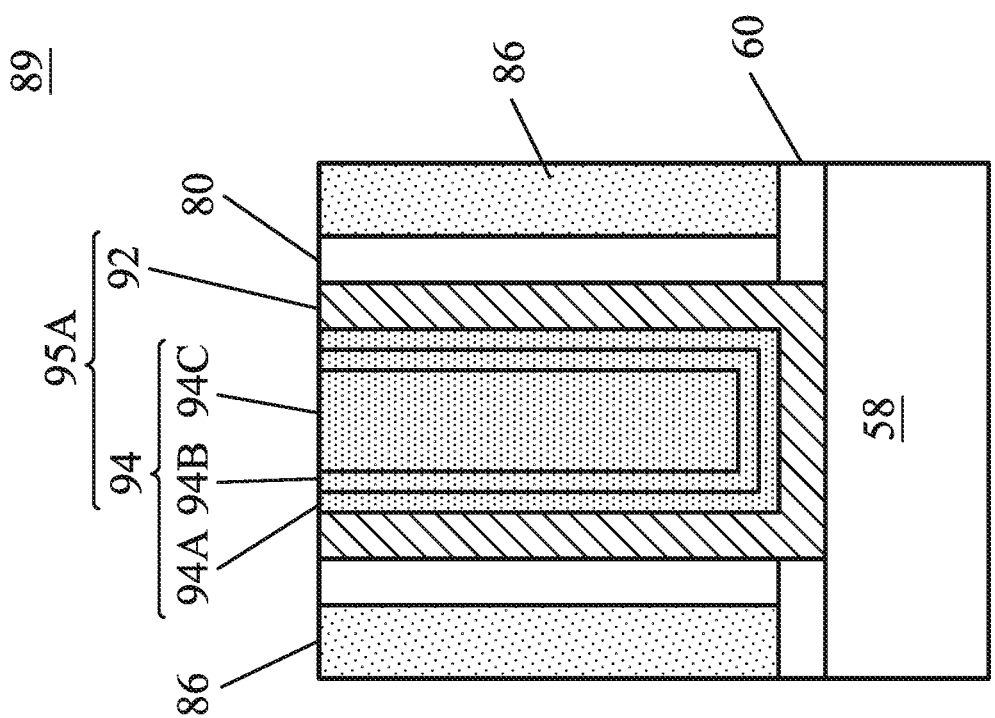

In FIGS. 20A, 20B and 20D, gate dielectric layers 92 and gate electrodes 94 are deposited in the openings 90 and 91 (see FIGS. 19A, 19B and 19D) to form replacement gate stacks 95A and 95D, respectively. FIG. 21B illustrates a detailed view of region 89 of FIG. 20B. In some embodiments, the replacement gate stacks 95A are active gates of the resulting FinFET device and the replacement gate stacks 95D are dummy gates that form the alignment structure 105. In some embodiments, the replacement gate stacks 95D are electrically isolated from devices and other functional features of the resulting FinFET device. The gate dielectric layers 92 deposited in the openings 90 (see FIGS. 19A, 19B and 19D) extend along top surfaces and sidewalls of the fins 52, exposed surfaces of the gate seal spacers 80, and exposed surfaces of the STI regions 56. The gate dielectric layers 92 deposited in the openings 91 (see FIGS. 19A, 19B and 19D) extend along exposed surfaces of the gate seal spacers 80 and exposed surfaces of the STI regions 56. In some embodiments, the gate dielectric layers 92 may comprise silicon oxide, silicon nitride, or multilayers thereof, or the like. In some embodiments, the gate dielectric layers 92 may include a high-k dielectric material, and in these embodiments, the gate dielectric layers 92 may have a k value greater than about 7.0, and may include a metal oxide or a silicate of hafnium, aluminum, zirconium, lanthanum, manganese, barium, titanium, lead, and combinations thereof, or the like.

The gate electrodes 94 are deposited over the gate dielectric layers 92 and fill the remaining portions of the openings 90 and 91. Although a single layer gate electrode 94 is illustrated in FIGS. 20B and 20D, the gate electrode 94 may comprise any number of liner layers 94A, any number of work function tuning layers 94B, and a conductive fill layer 94C as illustrated by FIG. 21B. The liner layers 94A may include TiN, TiO, TaN, TaC, combinations thereof, multi-layers thereof, or the like, and may be formed using PVD, CVD, ALD, a combination thereof, or the like. In regions 50N and 50D, the work function tuning layers 94B may include Ti, Ag, Al, TiAl, TiAlN, TiAlC, TaC, TaCN, TaSiN, TaAlC, Mn, Zr, combinations thereof, multi-layers thereof, or the like, and may be formed using PVD, CVD, ALD, a combination thereof, or the like. In regions 50P and 50D, the work function tuning layers 94B may include TiN, WN, TaN, Ru, Co, combinations thereof, multi-layers thereof, or the like, and may be formed using PVD, CVD, ALD, a combination thereof, or the like. In some embodiments, the conductive fill layer 94C may comprise Co, Ru, Al, Ag, Au, W, Ni, Ti, Cu, Mn, Pd, Re, Ir, Pt, Zr, alloys thereof, combinations thereof, multi-layers thereof, or the like, and may be formed using PVD, CVD, ALD, plating, a combination thereof, or the like. In some embodiments, the work function tuning layers 94B in the region 50N and the work function tuning layers 94B in the region 50D may comprise a same material. In other embodiments, the work function tuning layers 94B in the region 50P and the work function tuning layers 94B in the region 50D may comprise a same material.

After the filling of the openings 90 and 91, a planarization process, such as a CMP, may be performed to remove the excess portions of the gate dielectric layers 92 and the gate electrodes 94, which excess portions are over the top surface of the first ILD 88. The remaining portions of the gate electrodes 94 and the gate dielectric layers 92 thus form replacement gates stacks 95A and 95D. In some embodiments, the replacement gates stacks 95A are active gate stacks of the resulting FinFET device. In some embodiments, the replacement gates stacks 95D are dummy gate stacks and form the alignment structure 105. In other embodiments, the sacrificial gates 72 (see FIG. 18D) in the region 50D are not replaced by respective replacement gates. In such embodiments, the sacrificial gates 72 (see FIG. 18D) in the region 50D form the alignment structure 105.

The formation of the gate dielectric layers 92 in the regions 50N, 50P and 50D may occur simultaneously such that the gate dielectric layers 92 in each region are formed of the same materials. In other embodiments, the gate dielectric layers 92 in each region may be formed by distinct processes such that the gate dielectric layers 92 in different regions may be formed of different materials. The formation of the conductive fill layers 94C in the regions 50N, 50P and 50D may occur simultaneously such that the conductive fill layers 94C in each region are formed of the same materials. In other embodiments, the conductive fill layers 94C in each region may be formed by distinct processes such that the conductive fill layers 94C in different regions may be formed of different materials. Various masking steps may be used to mask and expose appropriate regions when using distinct processes.

Figure 22B:
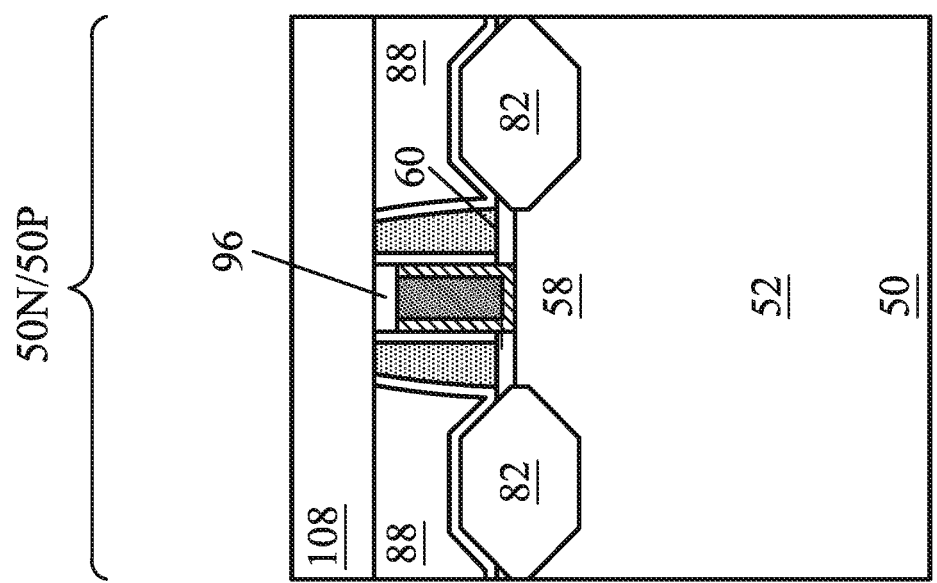
Figure 22A:
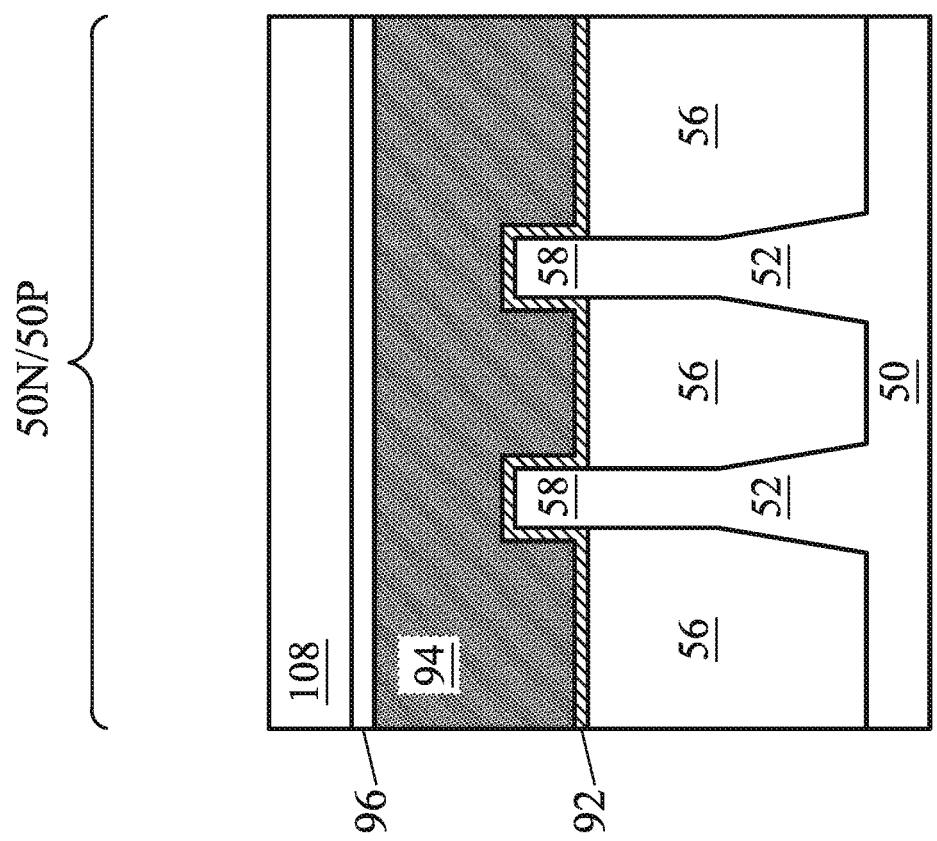
Figure 22D:
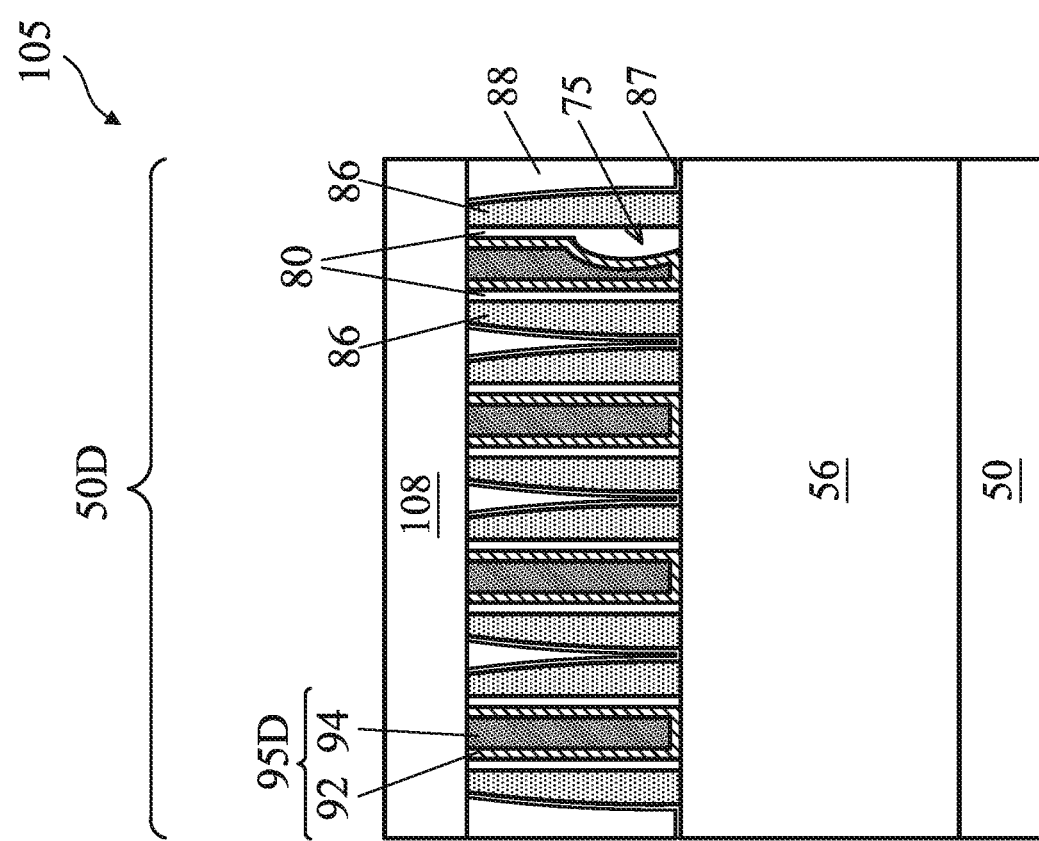

In FIGS. 22A, 22B and 22D, after performing the planarization process, a second ILD 108 is deposited over the first ILD 88 and the gate stacks 95A and 95D. In some embodiment, the second ILD 108 is a flowable film formed by a flowable CVD method. In some embodiments, the second ILD 108 is formed of a dielectric material such as PSG, BSG, BPSG, USG, a combination thereof, or the like, and may be deposited by any suitable method, such as CVD, PECVD, a combination thereof, or the like. In some embodiments, the first ILD 88 and the second ILD 108 comprise a same material. In other embodiments, the first ILD 88 and the second ILD 108 comprise different materials.

In some embodiments, before the formation of the second ILD 108, the gate stacks 95A are recessed, so that recesses are formed directly over the gate stacks 95A and between opposing portions of gate spacers 86. Gate masks 96 comprising one or more layers of a dielectric material, such as silicon nitride, silicon oxynitride, a combination thereof, or the like, are filled in the recesses, followed by a planarization process to remove excess portions of the dielectric material extending over the first ILD 88. The subsequently formed gate contacts 110 (see FIGS. 23A, 23B and 23D) penetrate through the respective gate mask 96 to contact the top surface of the respective recessed gate electrode 94.

Figure 23B:
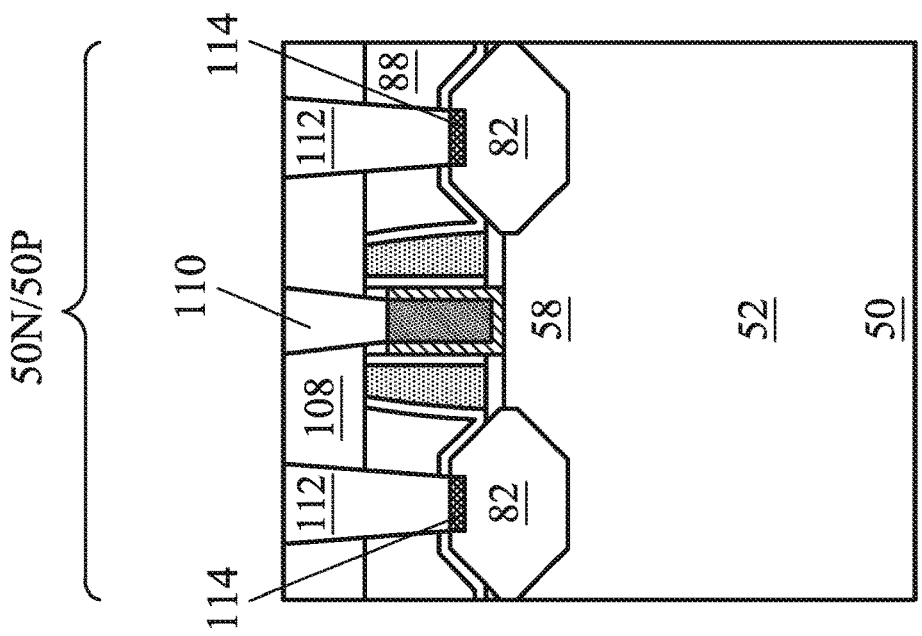
Figure 23A:
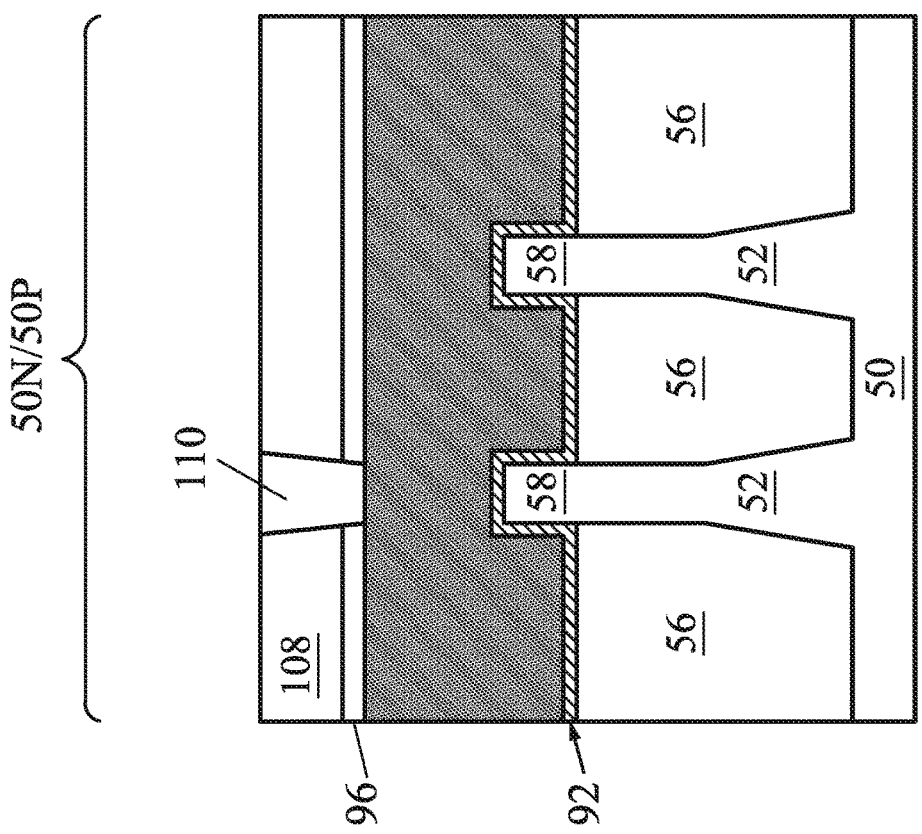
Figure 23D:
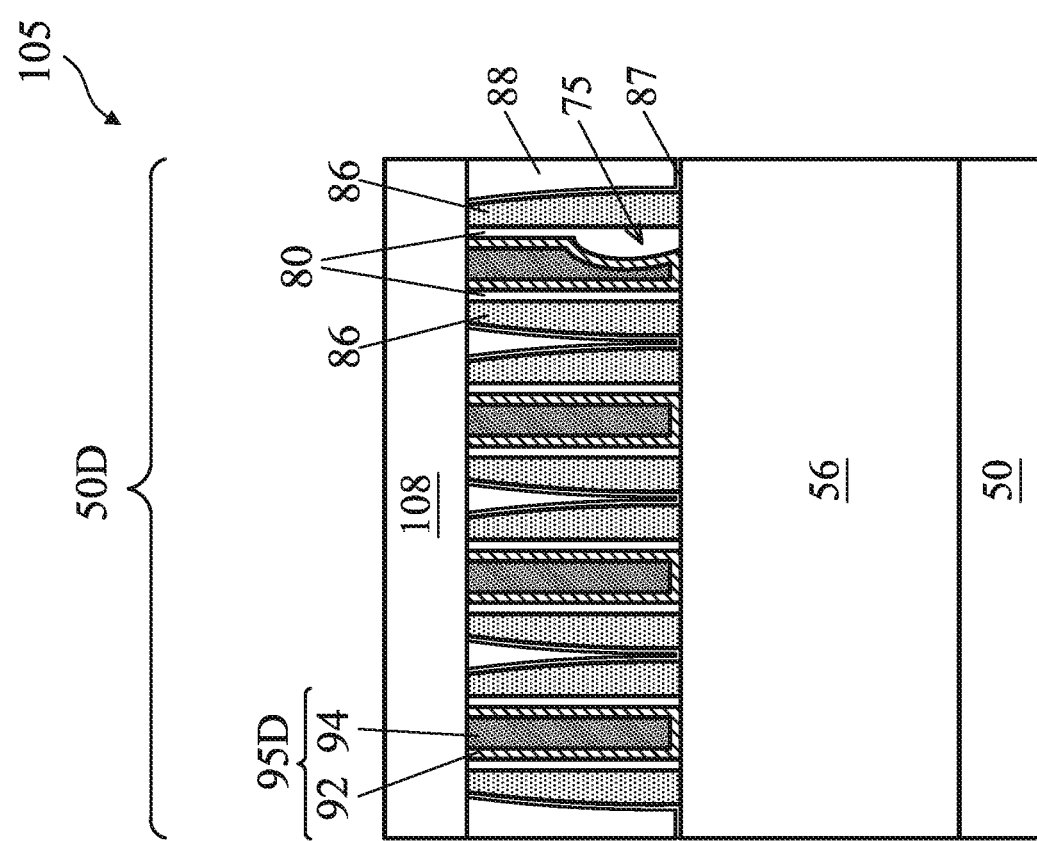

In FIGS. 23A, 23B and 23D, gate contacts 110 and source/drain contacts 112 are formed in the regions 50N and 50P through the second ILD 108 and the first ILD 88 in accordance with some embodiments. Openings for the source/drain contacts 112 are formed through the first ILD 88 and the second ILD 108, and openings for the gate contacts 110 are formed through the second ILD 108 and the gate masks 96. In some embodiments, the alignment structure 105 is used to align the openings for the source/drain contacts 112 with respect to the gate stacks 95A. By forming the dummy gate stacks 95D of the alignment structure without having footing features 73 (see FIG. 11D), overlay between the openings for the source/drain contacts 112 and the respective gate stacks 95A is improved and shorting between the source/drain contacts 112 and the respective gate stacks 95A is avoided.

The openings for the gate contacts 110 and the source/drain contacts 112 may be formed using acceptable photolithography and etching techniques. After forming the openings for the source/drain contacts 112, silicide layers 114 are formed through the openings for the source/drain contacts 112. In some embodiments, a metallic material is deposited in the openings for the source/drain contacts 112. The metallic material may comprise Ti, Co, Ni, NiCo, Pt, NiPt, Ir, PtIr, Er, Yb, Pd, Rh, Nb, a combination thereof, or the like, and may be formed using PVD, sputtering, a combination thereof, or the like. Subsequently, an annealing process is performed to form the silicide layers 114. In some embodiments where the epitaxial source/drain regions 82 comprise silicon, the annealing process causes the metallic material to react with silicon to form a silicide of the metallic material at interfaces between the metallic material and the epitaxial source/drain regions 82. After forming the silicide layers 114, unreacted portions of the metallic material are removed using a suitable removal process, such as a suitable etch process, for example.

Subsequently, a liner, such as a diffusion barrier layer, an adhesion layer, or the like, and a conductive material are formed in the openings for the source/drain contacts 112 and in the openings for the gate contacts 110. The liner may include titanium, titanium nitride, tantalum, tantalum nitride, a combination thereof, or the like. The conductive material may include copper, a copper alloy, silver, gold, tungsten, cobalt, aluminum, nickel, a combination thereof, or the like. A planarization process, such as a CMP process, may be performed to remove excess material from a surface of the second ILD 108. The remaining portions of the liner and the conductive material form the source/drain contacts 112 and the gate contacts 110 in the openings. The source/drain contacts 112 are physically and electrically coupled to the respective epitaxial source/drain regions 82, and the gate contacts 110 are physically and electrically coupled to gate electrodes 94 of the respective gate stacks 95A. The source/ drain contacts 112 and gate contacts 110 may be formed in different processes, or may be formed in the same process. Although shown as being formed in the same cross-sections, it should be appreciated that each of the source/drain contacts 112 and the gate contacts 110 may be formed in different cross-sections, which may avoid shorting of the contacts.

Figure 24:
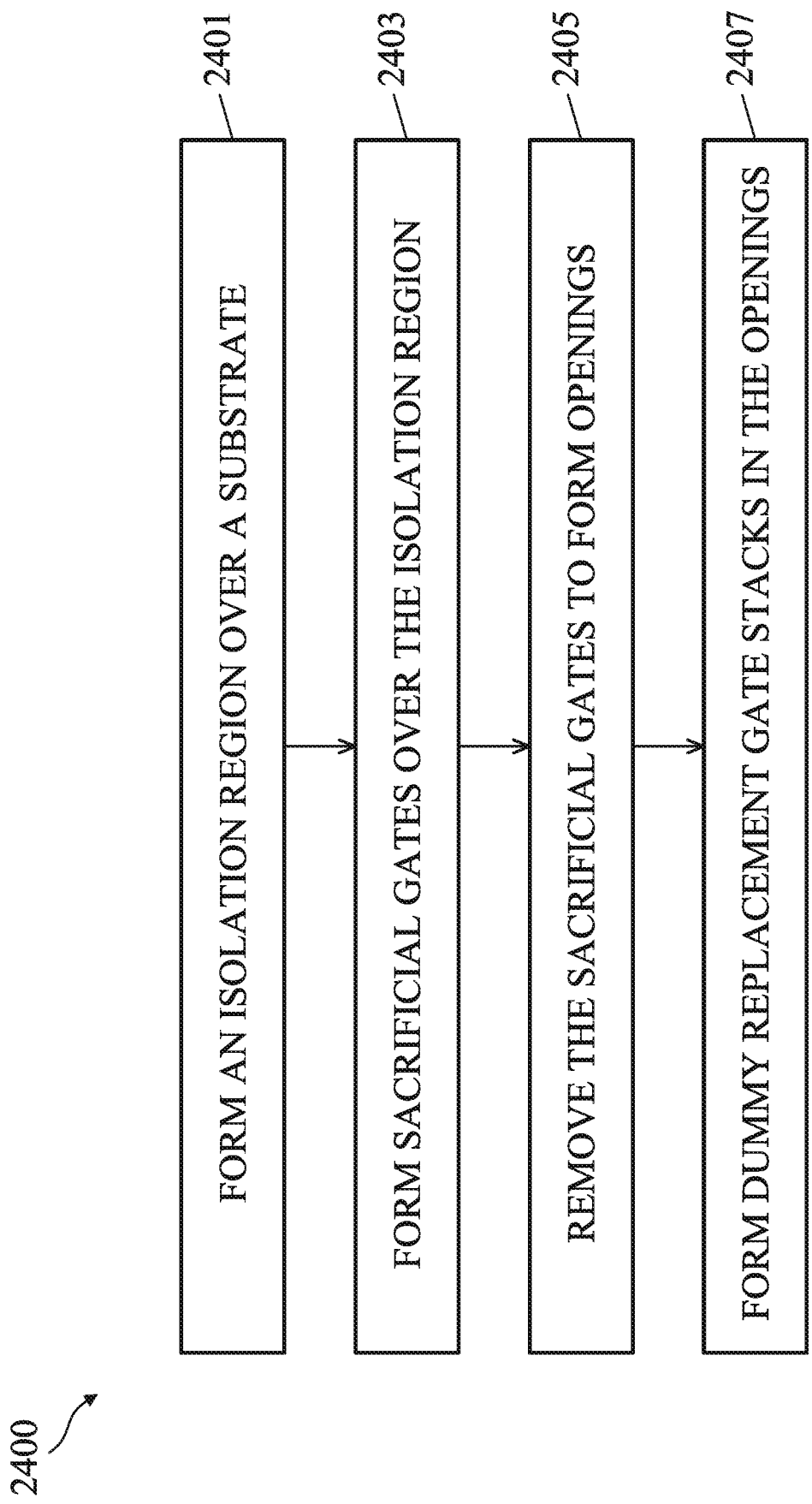
FIG. 24 is a flow diagram illustrating a method of forming of alignment structures in accordance with some embodiments.

FIG. 24 is a flow diagram illustrating a method 2400 of forming of alignment structures in accordance with some embodiments. The method 240o starts with step 2401, when an isolation region (such as the STI region 56 illustrated in FIG. 8D) is formed over a substrate (such as the substrate 50 illustrated in FIG. 8D) as described above with reference to FIGS. 8A and 8D. In step 2403, sacrificial gates (such as the sacrificial gates 72 illustrated in FIG. 12D) are formed over the isolation regions as described above with reference to FIGS. 10D-12D. In step 2405, the sacrificial gates are removed to form openings (such as the openings 91 illustrated in FIG. 19D) as described above with reference to FIG. 19D. In step 2407, dummy replacement gate stacks (such as the dummy gate stacks 95D illustrated in FIG. 20D) are formed in the openings as described above with reference to FIG. 20D.

In an embodiment, a method includes: forming an isolation region over a substrate; and forming an alignment structure over the isolation region, where forming the alignment structure includes: forming a sacrificial gate electrode layer over the substrate and the isolation region; patterning the sacrificial gate electrode layer to form a plurality of first sacrificial gates over the isolation region; and reshaping at least one of the plurality of first sacrificial gates, where the at least one of the plurality of first sacrificial gates is disposed at an edge of the alignment structure in a plan view, and where a sidewall of the at least one of the plurality of first sacrificial gates comprises a notch at an interface between the at least one of the plurality of first sacrificial gates and the isolation region. In an embodiment, forming the alignment structure further comprises replacing each of the plurality of first sacrificial gates with a dummy gate. In an embodiment, patterning the sacrificial gate electrode layer further forms a plurality of second sacrificial gates over an active region of the substrate. In an embodiment, method further includes replacing each of the plurality of second sacrificial gates with an active gate. In an embodiment, patterning the sacrificial gate electrode layer includes: performing a first etch process on the sacrificial gate electrode layer, the first etch process partially etching the sacrificial gate electrode layer; and performing a second etch process on the sacrificial gate electrode layer, the second etch process exposing a top surface of the isolation region, the second etch process being different from the first etch process. In an embodiment, reshaping the at least one of the plurality of first sacrificial gates comprises performing a third etch process on the at least one of the plurality of first sacrificial gates, the third etch process forming the notch, the third etch process being different from the second etch process. In an embodiment, the third etch process is different from the first etch process.

In another embodiment, a method includes: depositing an isolation region over a substrate adjacent an active region of the substrate; depositing a sacrificial gate electrode layer over the isolation region and the active region; and performing a first etch process on the sacrificial gate electrode layer to form a plurality of first sacrificial gates over the active region of the substrate and a plurality of second sacrificial gates over the isolation region; and performing a second etch process on the plurality of second sacrificial gates, the second etch process being different from the first etch process, where a sidewall of at least one of the plurality of second sacrificial gates comprises a notch at an interface between the at least one of the plurality of second sacrificial gates and the isolation region. In an embodiment, the method further includes: removing the plurality of first sacrificial gates to form a plurality of first openings; and forming a plurality of active gates in the plurality of first openings, where each of the plurality of active gates includes: a first gate dielectric layer in a respective one of the plurality of first openings; and a first gate electrode layer over the first gate dielectric layer in the respective one of the plurality of first openings. In an embodiment, the method further includes: removing the plurality of second sacrificial gates to form a plurality of second openings; and forming a plurality of dummy gates in the plurality of second openings, where each of the plurality of dummy gates includes: a second gate dielectric layer in a respective one of the plurality of second openings; and a second gate electrode layer over the second gate dielectric layer in the respective one of the plurality of second openings. In an embodiment, the plurality of dummy gates form an alignment structure, and the at least one of the plurality of dummy gates is disposed at an edge of the alignment structure in a plan view. In an embodiment, the first gate dielectric layer and the second gate dielectric layer include a same dielectric material. In an embodiment, the first gate dielectric layer and the second gate dielectric layer include different dielectric materials. In an embodiment, the first gate electrode layer and the second gate electrode layer include a same conductive material. In an embodiment, the first gate electrode layer and the second gate electrode layer include different conductive materials.

In yet another embodiment, a device includes: a substrate having an active region; an isolation region over the substrate and adjacent the active region; an active gate stack over the active region of the substrate; and an alignment structure over the isolation region, where the alignment structure includes a plurality of dummy gate stacks, a first dummy gate stack of the plurality of dummy gate stacks being disposed at a perimeter of the alignment structure in a plan view, a sidewall of the first dummy gate stack having a notch at an interface between the first dummy gate stack and the isolation region. In an embodiment, a first gate dielectric layer of the active gate stack and a second gate dielectric layer of the first dummy gate stack include a same material. In an embodiment, a first gate dielectric layer of the active gate stack and a second gate dielectric layer of the first dummy gate stack include different materials. In an embodiment, a first gate electrode layer of the active gate stack and a second gate electrode layer of the first dummy gate stack include a same material. In an embodiment, a first gate electrode layer of the active gate stack and a second gate electrode layer of the first dummy gate stack include different materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming an isolation region over a substrate; and
forming an alignment structure over the isolation region, wherein forming the alignment structure comprises:
forming a sacrificial gate electrode layer over the substrate and the isolation region;
patterning the sacrificial gate electrode layer to form a plurality of first sacrificial gates over the isolation region, wherein a first one of the plurality of first sacrificial gates is disposed at an edge of the alignment structure in a plan view, and wherein the patterning forms a footing feature at an interfaces between the first one of the plurality of first sacrificial gates and the isolation region; and
reshaping the first one of the plurality of first sacrificial gates, wherein the reshaping removes the footing feature and forms a notch in a sidewall of the first one of the plurality of first sacrificial gates at the interface between the first one of the plurality of first sacrificial gates and the isolation region.

2. The method of claim 1, wherein forming the alignment structure further comprises replacing each of the plurality of first sacrificial gates with a dummy gate.

3. The method of claim 1, wherein patterning the sacrificial gate electrode layer further forms a plurality of second sacrificial gates over an active region of the substrate.

4. The method of claim 3, further comprising replacing each of the plurality of second sacrificial gates with an active gate.

5. The method of claim 1, wherein patterning the sacrificial gate electrode layer comprises:
performing a first etch process on the sacrificial gate electrode layer, the first etch process partially etching the sacrificial gate electrode layer; and
performing a second etch process on the sacrificial gate electrode layer, the second etch process exposing a top surface of the isolation region, the second etch process being different from the first etch process.

6. The method of claim 5, wherein reshaping the first one of the plurality of first sacrificial gates comprises performing a third etch process on the first one of the plurality of first sacrificial gates, the third etch process removing the footing feature and forming the notch, the third etch process being different from the second etch process.

7. The method of claim 6, wherein the third etch process is different from the first etch process.

8. A method comprising:
depositing an isolation region over a substrate adjacent an active region of the substrate;
depositing a sacrificial gate electrode layer over the isolation region and the active region;
performing a first etch process on the sacrificial gate electrode layer to form a plurality of first sacrificial gates over the active region of the substrate and a plurality of second sacrificial gates over the isolation region;
performing a second etch process on the plurality of second sacrificial gates, the second etch process being different from the first etch process, wherein a sidewall of at least one of the plurality of second sacrificial gates comprises a notch at an interface between the at least one of the plurality of second sacrificial gates and the isolation region;
removing the plurality of first sacrificial gates to form a plurality of first openings;
forming a plurality of active gates in the plurality of first openings, wherein each of the plurality of active gates comprises:
a first gate dielectric layer in a respective one of the plurality of first openings; and
a first gate electrode layer over the first gate dielectric layer in the respective one of the plurality of first openings;
removing the plurality of second sacrificial gates to form a plurality of second openings; and
forming a plurality of dummy gates in the plurality of second openings, wherein each of the plurality of dummy gates comprises:
a second gate dielectric layer in a respective one of the plurality of second openings, wherein the first gate dielectric layer and the second gate dielectric layer comprise different dielectric materials; and
a second gate electrode layer over the second gate dielectric layer in the respective one of the plurality of second openings.

9. The method of claim 8, wherein the plurality of dummy gates form an alignment structure, and wherein the at least one of the plurality of dummy gates is disposed at an edge of the alignment structure in a plan view.

10. The method of claim 8, wherein the first gate electrode layer and the second gate electrode layer comprise a same conductive material.

11. The method of claim 8, wherein the first gate electrode layer and the second gate electrode layer comprise different conductive materials.

12. The method of claim 8, wherein the first etch process forms a footing feature at the interface between the at least one of the plurality of second sacrificial gates and the isolation region.

13. The method of claim 12, wherein the second etch process removes the footing feature and forms the notch in the sidewall of the at least one of the plurality of second sacrificial gates at the interface between the at least one of the plurality of second sacrificial gates and the isolation region.

14. The method of claim 8, further comprising forming a spacer structure on the sidewall of the at least one of the plurality of second sacrificial gates, the spacer structure filling the notch.

15. The method of claim 14, wherein an interface between the spacer structure and the at least one of the plurality of second sacrificial gates bends toward an interior of the at least one of the plurality of second sacrificial gates.

16. A method comprising:
forming an isolation region over a substrate; and
forming an alignment structure over the isolation region, wherein forming the alignment structure comprises:
depositing a sacrificial gate electrode layer over the isolation region;
performing a first etch process on the sacrificial gate electrode layer to form recesses in the sacrificial gate electrode layer, bottoms of the recesses being within the sacrificial gate electrode layer;
performing a second etch process on the sacrificial gate electrode layer to extend the recesses toward the isolation region and to form extended recesses, the extended recesses exposing the isolation region, portions of the sacrificial gate electrode layer interposed between adjacent extended recesses forming sacrificial gates over the isolation region, wherein a first sacrificial gate is disposed at an edge of the alignment structure in a plan view, and wherein the second etch process forms a footing feature in physical contact with a sidewall of the first sacrificial gate and a top surface of the isolation region; and performing a third etch process on the sacrificial gates to reshape the first sacrificial gate of the sacrificial gates, wherein the third etch process removes the footing feature and forms a notch in the sidewall of the first sacrificial gate at an interface between the first sacrificial gate and the isolation region.

17. The method of claim 16, wherein the first etch process is different from the second etch process.

18. The method of claim 17, wherein the third etch process is different from the first etch process and the second etch process.

19. The method of claim 16, further comprising forming a spacer structure on the sidewall of the first sacrificial gate, the spacer structure filling the notch, wherein an interface between the spacer structure and the first sacrificial gate is curved.

20. The method of claim 16, wherein forming the alignment structure further comprises replacing each of the sacrificial gates with a dummy gate.

\* \* \* \* \*